(12) United States Patent
Libove et al.

(10) Patent No.: US 6,642,878 B2
(45) Date of Patent: Nov. 4, 2003

(54) METHODS AND APPARATUSES FOR MULTIPLE SAMPLING AND MULTIPLE PULSE GENERATION

(75) Inventors: Joel M. Libove, Orinda, CA (US); Steven J. Chacko, Mill Valley, CA (US)

(73) Assignee: Furaxa, Inc., Orinda, CA (US)

( * ) Notice: Subject to any disclaimer, the term of this patent is extended or adjusted under 35 U.S.C. 154(b) by 0 days.

(21) Appl. No.: 10/218,860

(22) Filed: Aug. 13, 2002

(65) Prior Publication Data

US 2003/0048212 A1 Mar. 13, 2003

Related U.S. Application Data

(63) Continuation-in-part of application No. 09/876,016, filed on Jun. 6, 2001, now Pat. No. 6,433,720.

(51) Int. Cl.$^7$ ................................................. H03M 1/66
(52) U.S. Cl. ........................................ 341/144; 341/145
(58) Field of Search ................................ 341/144, 145, 341/152, 156

(56) References Cited

U.S. PATENT DOCUMENTS

| | | |
|---|---|---|
| 3,205,376 A | 9/1965 | Berry et al. |
| 3,527,966 A | 9/1970 | Forge |
| 3,622,808 A | 11/1971 | Uchida |
| 3,624,416 A | 11/1971 | Bleickardt |
| 4,060,739 A | 11/1977 | Russer et al. |
| 4,360,867 A | 11/1982 | Gonda |
| 4,442,362 A | 4/1984 | Rao |
| 4,706,045 A | 11/1987 | Ouyang et al. |
| 4,727,340 A | 2/1988 | Agoston et al. |
| 4,736,380 A | 4/1988 | Agoston |
| 4,755,742 A | 7/1988 | Agoston et al. |
| 4,758,736 A | 7/1988 | Agoston et al. |
| 4,806,891 A | 2/1989 | Kandpal |
| 4,873,499 A | 10/1989 | Algor |
| 4,928,248 A | 5/1990 | Takahashi et al. |
| 4,965,467 A | 10/1990 | Bilterijst |
| 4,995,044 A | 2/1991 | Blazo |
| 5,062,113 A | 10/1991 | Takahashi |
| 5,113,094 A | 5/1992 | Grace et al. |
| 5,115,409 A | 5/1992 | Stepp |
| 5,157,559 A | 10/1992 | Gleason et al. |
| 5,515,014 A | 5/1996 | Troutman |
| 5,574,755 A | 11/1996 | Persico |
| 5,587,687 A | 12/1996 | Adams |
| 5,635,863 A | 6/1997 | Price, Jr. |
| 5,708,377 A | 1/1998 | Bradley |

(List continued on next page.)

OTHER PUBLICATIONS

P. Gray & R. Meyer; Analysis and Design of Analog Integrated Circuits, pp. 590–605, John Wiley & Sons, 1984.
Maxmim 32–Channel Sample/Hold Amplifier with Output Clampoing Diodes, MAX5167, Publication No. 19–1675, Apr. 2000.

Primary Examiner—Brian Young
(74) Attorney, Agent, or Firm—Blakely Sokoloff Taylor & Zafman

(57) ABSTRACT

A method and apparatus for generating multiple ultra-fast (picosecond-range) electrical sampling apertures and pulses in response to a slewed control signal is disclosed. In one embodiment a series or sequence of sampling apertures are formed for sampling an input signal without the use of delay lines. In another embodiment, the input to be sampled is incrementally delayed to generate signals along a delay line. The delayed signals are simultaneously sampled in a sampling window to obtain a group of samples of an input signal at the same time. In another embodiment, a series or sequence of ultra-fast pulses are formed in an output signal without using delay lines. Parallel and serial sampler/pulser circuitry are disclosed.

56 Claims, 14 Drawing Sheets

U.S. PATENT DOCUMENTS

| | | |
|---|---|---|
| 5,768,700 A | 6/1998 | Kardontchik |
| 5,847,623 A | 12/1998 | Hadjichristos |
| 5,872,446 A | 2/1999 | Cranford, Jr. et al. |
| 5,900,747 A | 5/1999 | Brauns |
| 5,986,501 A | 11/1999 | Rafati et al. |
| 6,043,943 A | 3/2000 | Rezzi et al. |
| 6,054,889 A | 4/2000 | Kobayashi |
| 6,078,277 A | 6/2000 | Cheng |
| 6,087,871 A | 7/2000 | Kardo-Syssoev et al. |
| 6,118,339 A | 9/2000 | Gentzler et al. |
| 6,281,822 B1 | 8/2001 | Park |
| 6,433,720 B1 * | 8/2002 | Libove .................. 341/144 |

* cited by examiner

METHODS AND APPARATUSES FOR MULTIPLE SAMPLING AND MULTIPLE PULSE GENERATION

CROSS REFERENCE TO RELATED APPLICATION

This U.S. Patent Application is a continuation-in-part and claims the benefit of U.S. patent application Ser. No. 09/876,016 entitled "Methods, Apparatuses and Systems for Sampling or Pulse Generation" filed on Jun. 6, 2001 by inventors Libove et al, now allowed.

FIELD OF THE INVENTION

The invention relates generally to short duration sampling of input electrical signals and short duration pulse generation for output electrical signals.

BACKGROUND OF THE INVENTION

The generation of pulses and the generation of sampling apertures is important in a number of systems. With the operating frequency of systems increasing due to technological improvements, it becomes important to provide narrower or "ultra-fast" pulses and sampling apertures to match such increased operating frequencies of systems. A few exemplary systems where such "ultra-fast" pulses or sampling apertures are desirable include fiber optic communication systems, radar, communication systems, and time domain reflectometers.

Prior art systems for generating fast pulses have relied on expensive means such as step recovery diodes (SRDs), which generate a fast rising electrical voltage step that is then converted into an impulse by one or more capacitors, which differentiate the step, or a pulse-reversing device such as a shorted transmission line, which provides a delayed, inverted edge which cancels out the initial edge after a brief delay. The resulting pulse can be used to generate a sampling aperture by the use of a Schottky diode bridge whose diodes are turned on momentarily by the energy in the pulse. Sampling oscilloscopes such as the Tektronix 11801/CSA803 or the Agilent 54750A use such techniques. Another prior art technique for generating fast sampling apertures is to use a Gilbert Multiplier circuit which multiplies an input waveform by a fast pulse, such as one generated by a step recovery diode and a shorted transmission line or capacitor.

The above prior art techniques such as the SRD-based circuits suffer from variations in pulse position with temperature, and moderately high amounts of jitter. Secondly, the variable input impedance of the Schottky diodes is sub-optimal for input impedance matching. Additionally, the SRD requires several nanoseconds of carrier charging and discharging time, limiting the pulse-repetition rate to approximately 200 MHz. Also, it is difficult to incorporate into monolithic designs due to the constraints imposed in fabricating the step recovery diode, capacitors, and Schottky diodes on the same substrate. Finally, these circuits can be damaged easily by application of an over-voltage to the input.

BRIEF SUMMARY OF THE INVENTION

The present invention includes methods, apparatuses and systems as described in the claims.

DETAILED DESCRIPTION

In the following detailed description of the invention, numerous specific details are set forth in order to provide a thorough understanding of the invention. However, the invention may be practiced without these specific details. In other instances well known methods, procedures, components, and circuits have not been described in detail herein so as not to unnecessarily obscure aspects of the invention.

The invention relates to methods and apparatus for producing very short duration electrical pulses or sampling apertures for use in a number of possible electrical signaling and measurement systems. Applications include use as a sub-component in systems that can use either an ultra-fast time-gating element (sampler) or an ultra-fast pulse generator (pulser). Examples of such systems include ultra-wideband (UWB) communication systems, RADAR systems, transmission imaging systems, laser diode drivers, fiber optic receivers, sampling oscilloscopes, microwave spectrum analyzers, time domain reflectometers (TDRs), and other electrical communications and instrumentation apparatus.

Figure 1:
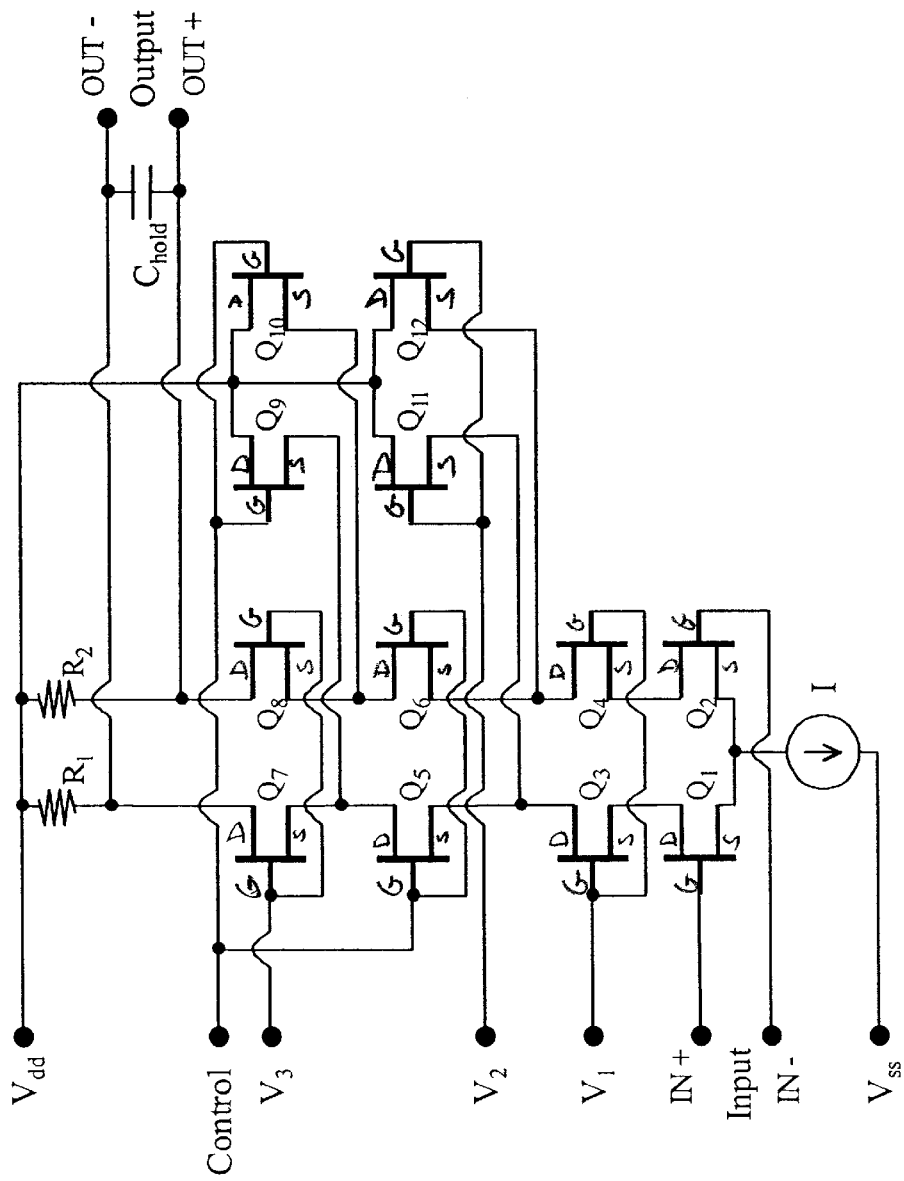
FIG. 1 is a schematic diagram of a single stage sampler/pulser circuit.

Referring now to FIG. 1, an embodiment of a sampler/pulser circuit of illustrated. In the sampler/pulser circuit of FIG. 1, a single edge of an electrical control signal effects both the initiation and extinction of an aperture or pulse that is generated. This is achieved by level-activated switching elements (transistors or diodes) within the circuit.

The sampler/pulser circuit of FIG. 1 uses differentially-paired transistors (DPTs) as the level-activated switching elements. In this circuit, enhancement mode GaAs MESFETS are used for transistors Q1 through Q12 coupled together as shown in FIG. 1.

Each of the transistors includes a control terminal (i.e., a gate, denoted by "G"), a first terminal (i.e., a source, denoted by "S"), and a second terminal (i.e., a drain, denoted by "D"). An input signal, "Input", is provided between terminals IN+ and IN− and coupled to the control terminals or gates of a conventional differential pair comprised of transistors Q1 and Q2. The drain terminals of transistors Q1 and Q2 can optionally couple to the source terminals of a conventional cascode stage comprised of transistors Q3 and Q4 respectively. The gates of transistors Q3 and Q4 are biased by a fixed voltage $V_1$ that may typically be approximately one volt higher than the highest potential on IN+ and IN− terminals so they can stay on. The drain terminals of Q3 and Q4 (or alternatively drain terminals of Q1 and Q2 without the cascode stage) are coupled to the source terminals of transistors Q5, Q6, Q11, and Q12, comprising a bottom portion of the sampler/pulser circuitry. The drain terminals of Q5 and Q6 form the outputs of the bottom portion, and are coupled to the source terminals of Q7, Q8, Q9 and Q10, comprising a top portion of the sampler/pulser circuitry.

The sampler/pulser circuit has three distinct operational states determined by the voltage level of the control signal, Control. The circuit transitions sequentially through all three states as the voltage level of the control signal, Control, falls from an initial voltage that is greater than the fixed input voltage V3, to the second state in which Control is between the voltage of the fixed input voltage V3 and the fixed voltage V2, to the third state in which Control's voltage is less than fixed voltage V2. Typically V2 can be approximately between one to two volts higher than voltage V1, and V3 can be approximately between one to two volts higher than V2. The control signal, Control, typically begins at a voltage level that is approximately the voltage level of Vdd, the power supply. The voltage level of Vdd is typically one to three volts higher than V3. At the time one desires to create a sampling aperture or pulse, the control signal is slewed in a negative direction, so that it ultimately ends up at a voltage that is less than V2.

If the control signal is initially greater than V3 by more than a few tenths of a volt, transistor Q9 and Q10 are "on" (biased into the forward conduction region) and transistors Q7 and Q8 are "off" (biased so that essentially no current flows), resulting in the output nodes being pulled up to Vdd, causing the sampling gate to be turned "off" (the output nodes contain no signal).

Similarly, if the level of the control signal at the end of its falling transition is less than V2 by a few tenths of a volt, transistors Q11 and Q12 are "on" and transistors Q5 and Q6 are "off", resulting in the output nodes being pulled up to Vdd, and the sampling gate again being turned off. However, during the active falling of the control signal, when the control signal is between V2 and V3, transistors Q5, Q6, Q7, and Q8 are all "on" (and Q9, Q10, Q11, and Q12 all "off") resulting in the sampling gate being turned on. In this case, the differential input signal across the input terminals IN+ and IN− is multiplied by the circuit gain to generate a differential output signal across OUT+ and OUT− terminals.

Thus, as the control signal Control traverses the range defined by V3 and V2, this off-on-off sequence results in a sampling aperture being created in which the input is coupled to the output for a brief, and highly controllable period of time. At all other times the output is isolated from the input. In the event that the invention is to be used as a sampler (and not a pulser) the output value is desired to be held even after the sampling aperture is closed, and an optional capacitor $C_{HOLD}$ is connected between the two output terminals, as shown in FIG. 1. The circuit generates an aperture/pulse regardless of direction of the transition of the trigger signal (low-to-high, or high-to-low).

If, on the other hand, an aperture or pulse is only desired during one transition, then the current source, I, may be turned off, using conventional circuitry, during the time the transition occurs in which we do not desire to generate an aperture or pulse. For example, if an aperture is desired only during the rising edge of Control, the current source I would be turned off after the rising edge is over, and turned on again shortly before the next rising edge of Control. This will avoid any current being channeled to the output terminals during the falling transition of Control.

Transistors Q3 and Q4 are optional. However, when transistors Q3 and Q4 are utilized, the input stage operates in a cascode mode to prevent switching transients in Q5, Q6, Q11, and Q12 from coupling to the input terminals via drain-to-gate capacitance in Q1 and Q2. This results in far lower "kick out" voltage at the inputs and better high-frequency gain and higher input impedance. While the circuit of FIG. 1 is a differential-mode embodiment, a simpler single-ended (non-differential) implementation may be used by removing transistors Q4, Q6, Q8, Q10 and Q12. Additionally, the differential output of the circuit of FIG. 1 can be converted into a single-ended output by coupling the OUT+ and OUT− output terminals to a conventional differential amplifier or BALUN (Balanced-to-unbalanced) transformer.

Figure 2A:
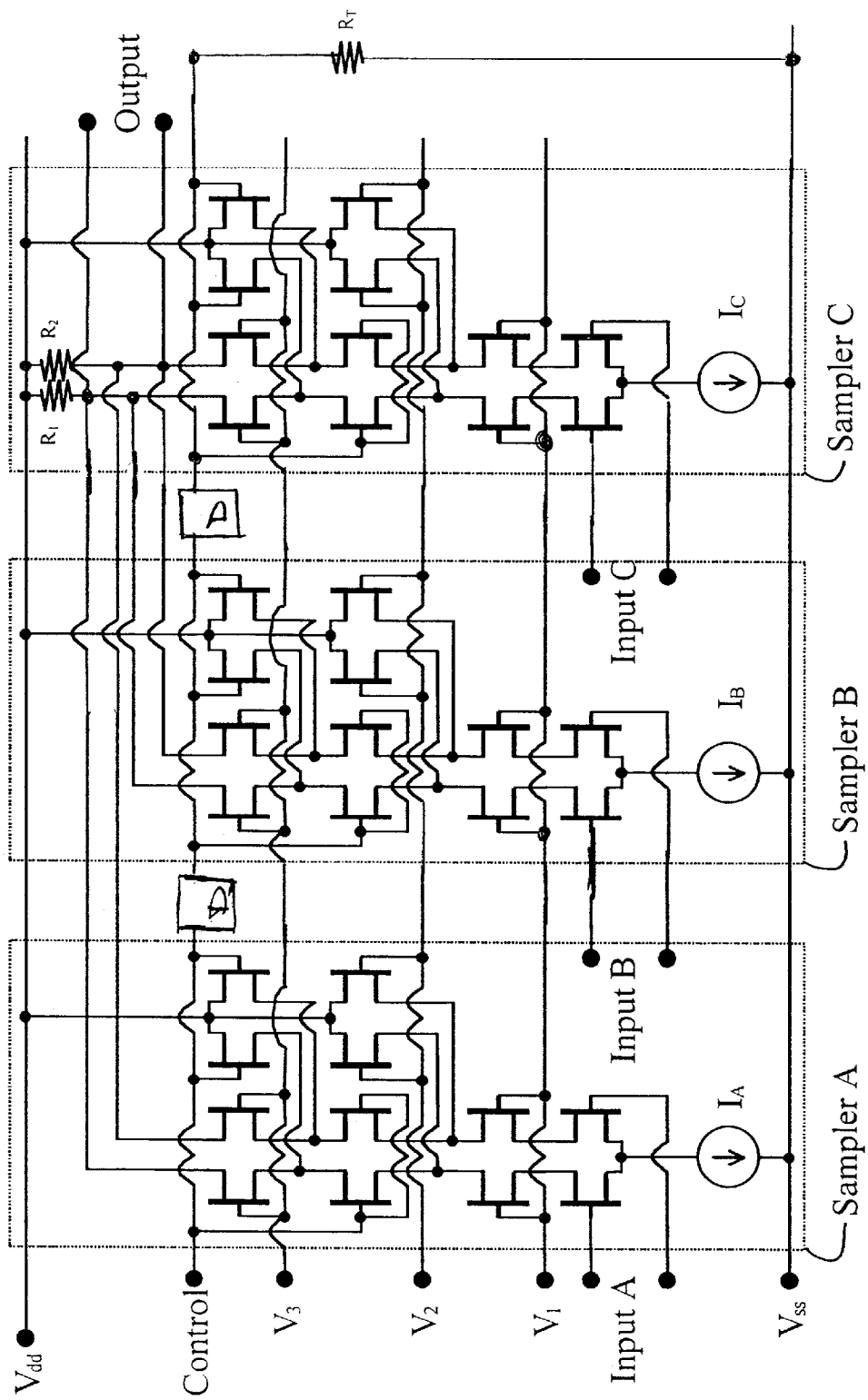
FIG. 2A is a schematic diagram of an embodiment of multiple stages of sampler/pulser circuits with delay lines.

Referring now to FIG. 2A, multiple samplers/pulsers are illustrated combined together using delay lines. Samplers/pulsers can also be referred to as aperture/pulse elements. In FIG. 2A, a first sampler/pulser (labeled sampler A) having inputs A, a second sampler/pulser (labeled sampler B) having inputs B, and a third sampler/pulser (labeled sampler C) having inputs C are coupled together as shown sharing a pair of pull-up resistors (R1 and R2) and delay line elements D. Each sampler/pulser can also be referred to herein as a sampling head or a pulse generator. The delay line elements D are inserted as shown before the control inputs of sampler B and sampler C with a termination resistor $R_T$ coupled to the control signal input of the last sampler stage, sampler C.

The combination of multiple samplers/pulsers allows for direct synthesis and detection of complex pulses. The stability of the resulting architectures, combined with the matching of a monolithic integrated circuit (IC) implementation allows for faster and more complex pulse generating or sampling structures. By using multiple pulse generator circuits combined together on a single IC, and fired off in rapid succession via a string of short delay lines, direct synthesis of ultra-fast complex waveforms may be achieved, such as those required in the emerging areas of ultra-wideband (UWB) radar and communications. Similarly, when used in a receiver, the input from the antenna may be connected, via a string of short delay lines, to the inputs of several of the sampling heads of the invention, for the purpose of providing an output whose amplitude is proportional to the convolution of the input pulse and a predetermined matched waveform.

If the matched waveform is to contain only positive amplitudes, the input signal is only connected to the positive inputs (right-hand FET gates, Q2) of the three sampling heads shown in FIG. 2A, while the negative inputs are connected to ground.

If however, the matched waveform is desired to have negative lobes, such as an approximation of a sin (t)/t waveform, then the input is connected to the negative input (left hand FET gate, Q1) of the leftmost sampling head (labeled generator A), while a delayed version of the input is connected to the positive input (right-hand FET gate, Q2) of the middle sampling head (labeled generator B), and a further delayed version of the input is connected to the negative input (left hand FET gate, Q1) of the rightmost sampling head (labeled generator C). In this way, for example, if 30 picosecond delay lines are used, the differential output, $V_{out}$, of the entire system will be given, at a time slightly greater than t, by:

$$V_{out} = [-I_A \times V_{in}(t-60\ ps)] + [I_B \times V_{in}(t-30\ ps)] - [I_C \times V_{in}(t)]$$

This ultra-fast correlation capability is important when detecting and recognizing incoming pulses that have complex, distorted, wave shapes, such as, for example in UWB communications systems that may be deliberately band-limited, so as to avoid interfering with aircraft and public service bands, or in a fiber optic receiver in which dispersion and high-frequency attenuation have smeared the impulse response of the system. The invention will facilitate lowering costs of such correlating receivers for low cost communication systems of the future. The tight time-matching and stability, low power dissipation, high and constant input impedance, and small size and low cost of the sampling heads and pulsers of the invention will help facilitate a new generation of low cost radar communications transmitters and receivers, time domain reflectometers and transmission test sets, and time domain imaging systems.

The previously described circuits can be modified to produce a sequence, a series, or multiple apertures or pulses in an integrated circuit, rather than merely a single aperture or pulse.

Methods and apparatus are disclosed for generating multiple apertures or pulses on a single IC, without the need for delay line elements. Parallel aperture/pulse sequence generator architectures allow for simple implementation of complex aperture/pulse sequence generation, increased performance, and decreased costs without delay line elements. Alternate serial aperture/pulse sequence generation architectures are further disclosed for complex aperture/pulse sequence generation that enjoy increased performance, decreased power usage and transistor count over the disclosed parallel implementations. Such serial implementations do not enjoy the "dual use" of parallel implementations, and embodiments for serial samplers and pulsers are thus treated separately herein.

An array of sampler/pulsers are disclosed which are triggered at different voltage levels to eliminate delay line elements, and better control the initiation and extinction of each of the resulting apertures/pulses. Circuit architectures are further disclosed for the elimination of redundant elements that may yield improvements in performance, reduced IC chip area, and lower power usage.

Referring momentarily back to FIG. 1, the prior differentially-paired transistor (DPT) architecture can be described as a sampler/pulser that uses a single edge of a control signal to effect a single aperture or pulse. As the control signal Control slews negatively from an initial voltage higher than V3 to a final voltage lower than V2, the aperture/pulse is initiated as the voltage of the control signal Control reaches V3 and extinguished as the voltage of the control signal Control reaches V2. As described previously, these voltages, V3 and V2, can be varied within a range defined by the supply voltages Vdd and Vss. It is thus possible using settings of V2 and V3 to vary the position of the aperture/pulse with respect to the beginning of the negative-going edge of the control signal Control, as well as modulate the width of the aperture/pulse.

Figure 2B:
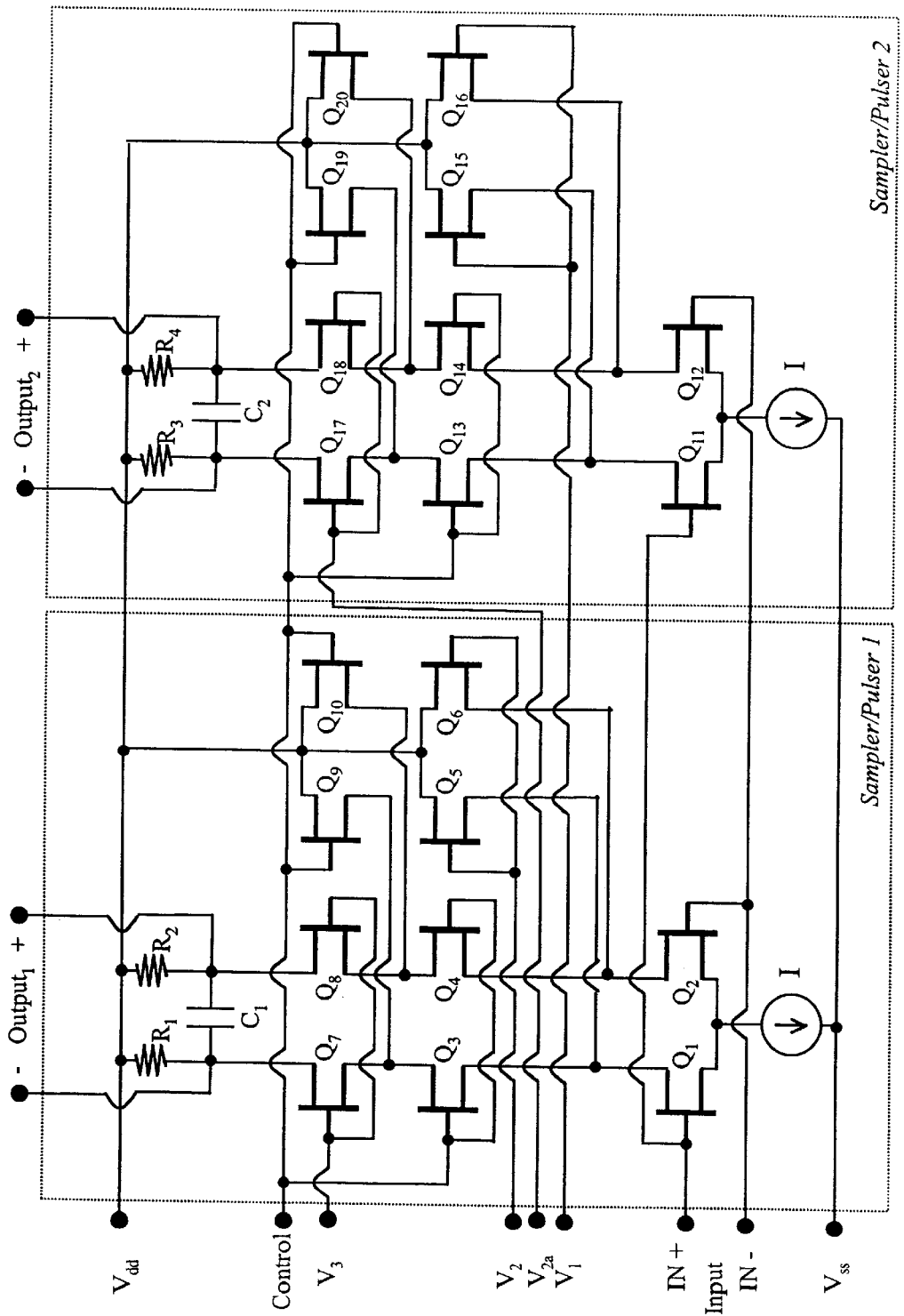
FIG. 2B is a schematic diagram of an embodiment of multiple stages/channels of sampler/pulser circuits without delay lines.

Furthermore, multiple samplers or pulsers within a single falling edge can be triggered by using separate, and possibly different, initiation/extinction voltages (i.e., settings of V2 and V3) for each sampler/pulser in an array. Thus, N multiple apertures/pulses can be generated by using a single edge of the control signal Control. A simple case, where N=2, of a parallel architectural structure to provide multiple apertures/pulses is shown in FIG. 2B. Each of these apertures/pulses can be tightly controlled in time and duration with respect to the control signal Control by means of DC voltages. Of particular interest is the ability to generate sequences of apertures/pulses without the use of delay line elements. While the flexibility of the multiple aperture/pulse sequence generator shown in FIG. 2B may be desired for some applications, some common aperture/pulse sequence applications allow further circuit simplification, leading to increased performance, reduction in chip area, and reduction in power usage.

Referring now to FIG. 2B, two sampler/pulsers circuits (Sampler/Pulser 1 and Sampler/Pulser 2) are connected to operate in parallel with respect to the control signal Control input. Each control input of each sampler/pulser circuit has the control signal Control connected thereto. Each sampler/pulser circuit shares the same power supplies Vdd and Vss, and input terminals IN+ and IN−. A differential input signal "Input" across the input terminals IN+ and IN− is multiplied by the circuit gain to generate a pair of differential output signals Output1 and Output2 across their respective plus and minus terminals. In the case of a pulse generation architecture, the input signal Input is multiplied by the circuit gain to generate a pair of differential output signals Output1 and Output2 across their respective plus and minus terminals. This input signal may be a DC voltage level signal. In the case of a sampler circuit, the input signal Input is sampled at the respective sampling apertures.

Each sampler/pulser circuit may have differing levels of initiation and extinction voltages. Sampler/Pulser 1 has voltage levels V3 and V2 for initiation/extinction voltages. Sampler/Pulser 2 has voltage levels V2a and V1 for initiation/extinction voltages separate and apart from the initiation/extinction voltages of sampler/pulser 1. Sampler/Pulser 1 has an output 1 to generate a separate output sample/pulse. Sampler/Pulser 2 has an output 2 to generate a separate output sample/pulse from that of output 1.

Each sampler/pulser of FIG. 2B has a "pre-initiation" current path, an "active" current path, and a "post-extinction" current path. Thus, at any given time, one low-impedance current path may exist for each sampler/pulser in the IC. Generalizing, an IC having N samplers/pulsers operating in parallel similar to FIG. 2B, may have N active current paths at any time, with each sampler/pulser having 5N transistor pairs.

A special but common case in the generation of sampling apertures/pulses occurs when the extinction of the first aperture/pulse occurs simultaneously with the initiation of the second aperture/pulse. This may be referred to as a non-overlapping or sequential operating condition. Given this sequential operation of the sampler/pulsers, only a single sampler or pulser must be active at any one time (except briefly, during transition periods, when two elements may be considered active).

In this case, the parallel structure of sampler/pulsers of FIG. 2B is overly general. A serial design of sampler/pulsers, in which only a single sampler/pulser is active at any one time, can provide savings in both power usage and number of transistors required, as well as provide a better sample-to-sample uniformity.

In a serial sampler/pulser architecture, the extinction of the (N−1)th aperture or pulse results in the initiation of the Nth aperture or pulse. Current is "handed off" to the next aperture or pulse at the state transitions. A single current path actively conveys the current generated by input transistor pair. Which one of the current paths is active depends upon the level of the control signal Control. The parallel sampler/pulser architecture of FIG. 2B can be modified into a serial form by having V2A=V2 with only one V2 DC voltage input, configuring the circuit so that the previously shunted current feeds the second sampler/pulser, and eliminating redundant transistors.

Figure 3:
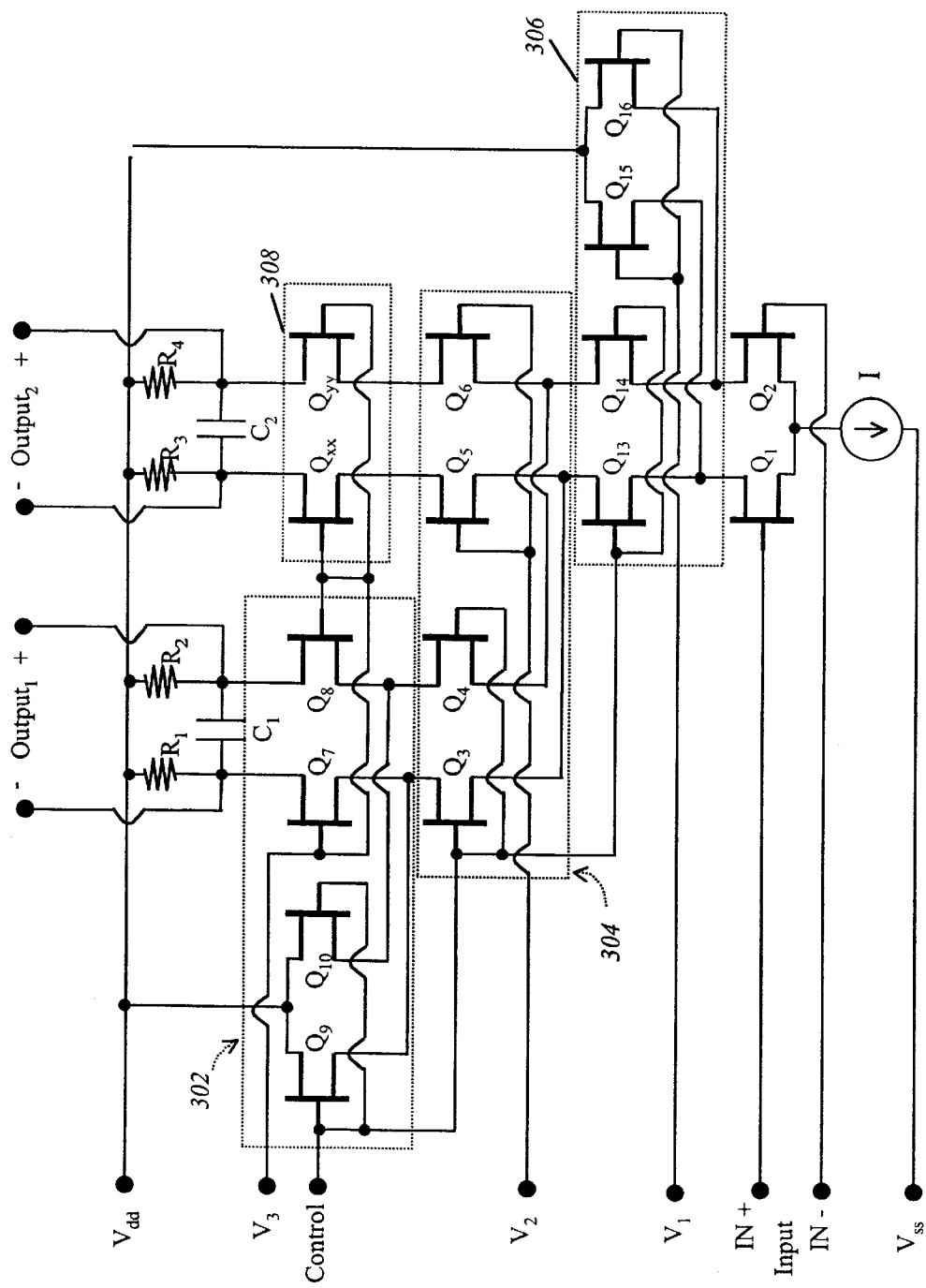
FIG. 3 is a schematic diagram of a two stage/channel integrated sampler circuit for acquiring two sequential samples.

Referring now to FIG. 3, an exemplary serial sampler circuit is illustrated for the case of N=2. The serial sampler circuit of FIG. 3 includes a sampler 1, a sampler 2 and other elements coupled together as shown and illustrated. Sampler 1 includes the transistor pairs of Q9/Q10, Q7/Q8, Q3/Q4, and Q5/Q6 coupled together as shown and illustrated in FIG. 3. The DPTs of Q9/Q10 and Q7/Q8 may also be referred to as initiation DPTs 302 for the first sampler. Sampler 2 includes the transistor pairs of Q3/Q4, Q5/Q6, Q13/Q14, and Q15/Q16 coupled together as shown and illustrated in FIG. 3. The DPTs of Q13/Q14 and Q15/Q16 may also be referred to as extinction DPTs 306 for the second sampler.

Notice that the two samplers share transistor pairs Q3/Q4 and Q5/Q6. These four transistors serve two purposes as part of the first sampler and the second sampler. In the first sampler, the DPTs of Q3/Q4 and Q5/Q6 serve as an "extinction" purpose. The DPTs of Q3/Q4 and Q5/Q6 may also be referred to as extinction DPTs 304 for the first sampler. In the second sampler, the DPTs of Q3/Q4 and Q5/Q6 serve as an "initiation" purpose. The DPTs of Q3/Q4 and Q5/Q6 may also be referred to as initiation DPTs 304 for the second sampler. Notice further that the two samplers share the input pair Q1/Q2. This sharing of transistors reduces the transistor count when compared to the previously discussed parallel implementation.

The pair of transistors Qxx/Qyy coupled together as shown and illustrated in FIG. 3 are optional transistors 308 to provide symmetry in the current flow paths. The transistor pair of Q1/Q2 comprises a differential input pair to sample an input signal.

Comparing the serial sampler architecture of FIG. 3 with the parallel architecture of FIG. 2B, a number of changes can be seen. The number of transistor pairs to accomplish the sequential sample aperture generation is reduced.

The parallel architecture illustrated in FIG. 2B used ten transistor pairs. The serial architecture of FIG. 3 uses eight transistor pairs, including an optional transistor pair of transistors Qxx and Qyy. The optional transistor pair of transistors Qxx and Qyy allow for frequency response matching and can be eliminated to further reduce the transistor count of the serial architecture of FIG. 3 to seven transistor pairs. In contrast to the 5N transistor pairs required for the parallel structure of FIG. 2B, the serial structure of FIG. 3, when generalized to N samplers, requires only 2N+3 transistor pairs. Second, the circuit has a single input transistor pair, in contrast to the N transistor pairs required for implementations eliminating any input pair matching requirements. Finally, the energy efficiency of the circuit of FIG. 3 is nearly twice that of the circuit of FIG. 2B due to the combination of the current paths previously accomplished by separate paths. In contrast to the N possible current paths being active in a parallel implementation, only one current path is active in the serial implementation.

Figure 4:
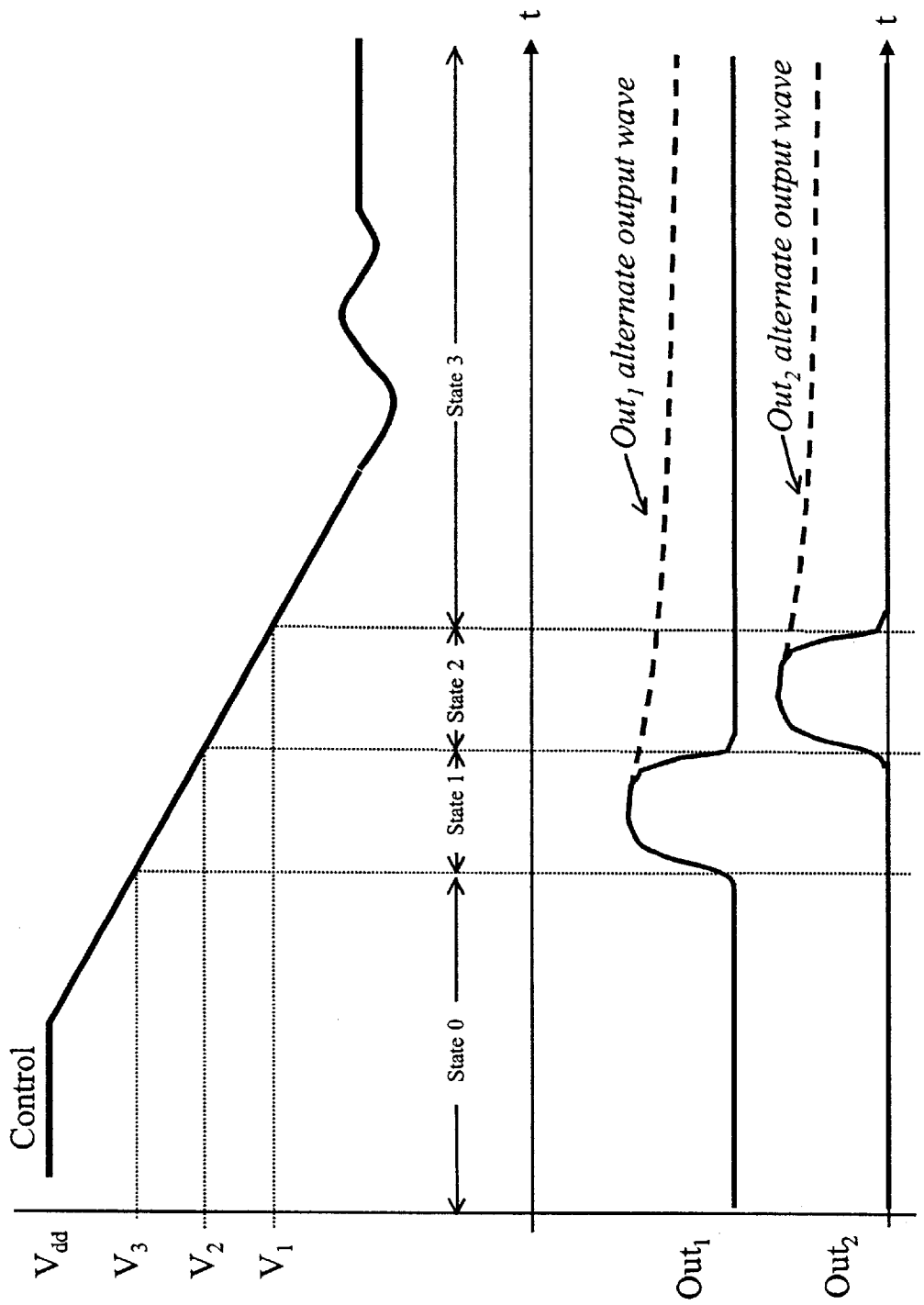
FIG. 4 is a wave form diagram illustrating the operation of the embodiments of the invention illustrated in FIGS. 2B and 3.

Referring now to FIG. 4, a waveform diagram illustrates the operation of the serial circuit architecture of FIG. 3. FIG. 4 illustrates a waveform for the control signal Control, Out1, and Out2 versus time t. The waveform Out1 corresponds to Output1. The waveform Out2 corresponds to Output2.

The operation of the serial circuit architecture of FIG. 3 is based upon the "opening" and "closing" of multiple transistor pairs acting as voltage level activated switches. Given that V3>V2>V1, control signal Control starts at a voltage level greater than V3 and slews in the negative direction to a voltage level less than V1, the circuit of FIG. 3 exhibits four distinct states as depicted in FIG. 4. The four distinct states are referred to herein as State 0, State 1, State 2, and State 3.

In the initial or beginning state (i.e., "State 0") the control signal Control is at a voltage level greater than V3, transistors Q9, Q10, Q3, Q4, Q13, Q14, Q1, and Q2 are turned "on" while the other transistors of the serial sampler circuit of FIG. 3 are turned "off". In State 0 both sampling gates may be considered to be effectively "off" because there is essentially no current flow from the input pair of transistors Q1, Q2 to any output (i.e., Output1 or Output2), even though current is always flowing in Q1 and Q2. In State 0, the current flowing in Q1 and Q2 is steered via transistors Q13/Q14 and Q3/Q4 and Q9/Q10, so that it does not flow through transistor pairs Q7/Q8 and Q5/Q6, and therefore never reaches output 1 or output2 In the circuit of FIG. 3, the current flow in State 0 is from Vdd through transistor pairs Q9/Q10, Q3/Q4, Q13/Q14, Q1/Q2, and the current source I into Vss, effectively bypassing the outputs.

As the control signal Control falls to a voltage below V3 but greater than V2, referred to as State 1, transistors Q9 and Q10 turn "off" and transistors Q7 and Q8 turn "on". The other transistors of the circuit of FIG. 3 remain in the same condition (on or off) as they were in State 0. In State 1 with transistors Q7 and Q8 turned "on", the first sampling gate is opened, connecting the input pair of transistors Q1/Q2 to the output terminals of Output1. This opens or initiates a first sampling aperture, as illustrated in the waveform Out1 of FIG. 4.

As the control signal Control continues to fall to a voltage less than V2 but greater than V1, referred to as State 2, transistors Q3 and Q4 turn "off" and transistors Q5 and Q6 turn "on". In State 2 with transistors Q3 and Q4 turned "off", the first sampling gate is closed, generating a high impedance between the input pair of transistors Q1/Q2 and the output terminals of Output1. This closes or extinguishes the first sampling aperture as illustrated in the waveform Out1 of FIG. 4. In State 2 with transistor pairs Q5/Q6, Q13/Q14, and optional transistor pair Qxx/Qyy turned "on", the second sampling gate is opened, connecting the input pair of transistors Q1/Q2 to the output terminals of Output2. This opens or initiates a second sampling aperture, as illustrated in the waveform Out2 of FIG. 4, generating a low impedance between the input pair of transistors Q1/Q2 and the output terminals of Output2.

As the control signal Control continues to fall to a voltage less than V1, referred to as State 3, transistors Q13 and Q14 turn "off" while transistors Q15 and Q16 turn "on". In State 3 with transistors Q13 and Q14 turned "off", the second sampling gate is closed, generating a high impedance between the input pair of transistors Q1/Q2 and the output terminals of Output2. This closes or extinguishes the second sampling aperture as illustrated in the waveform Out2 of FIG. 4. In State 3, the current flows through transistor pairs Q15/Q16 and Q1/Q2 which are turned "on" and current source I. Except for possible leakage currents, current does not flow to or from any output (i.e., Output1 or Output2).

Thus, the circuit of FIG. 3 generates sequential apertures with fewer transistors and less overall energy than the circuit of FIG. 2B. The redirection of current in "active" aperture paths of the circuit of FIG. 3 avoids shunted or wasted power.

While the circuit of FIG. 3 illustrates N=2 samplers, the circuit can be extended to N samplers. The limitation of a lack of voltage overhead (i.e., the difference between Vdd and Vss) on the number of samplers in a serial architecture can be alleviated by using optional level shifting circuitry.

In FIG. 4, the waveforms for OUT1 and OUT2 illustrate alternate output waveforms respectively by using dashed lines. The dashed lines are the resultant output waveforms from the sampler circuit of FIG. 3 when used as a multiple sampler. In this case, the values of the sampled signals are desired to be held on the outputs OUT1 and OUT2 for an extended period of time, so that, for example, they can be read by slower devices, such as analog-to-digital (A/D) converters. The alternate output waveforms may be achieved by increasing the resistance values of R1, R2, R3 and R4, or by increasing the capacitance values of capacitors C1 and C2, or by increasing both the resistance and capacitance of each respectively. A time constant for the decay in the output may be determined by multiplying the capacitance of the holding capacitors, C1 and C2, with the resistance values of R1, R2, R3 and R4.

If the holding capacitors C1 and C2 have a capacitance of zero or are removed, and the resistors have low values, such as 50 ohms, the waveforms for the outputs OUT1 and OUT2 resemble pulses as illustrated by the solid lines in the waveforms. If the capacitance of the holding capacitors C1 and C2 and the resistance of the resistors R1, R2, R3 and R4 have very high values, the output waveforms OUT1 and OUT2 more resemble a horizontal lines.

In practice, the output voltage values is not held indefinitely, even though the resistance of the resistors are increased to near infinity. This is due to leakage currents in the transistors. The droop in the alternate output waveforms of OUT1 and OUT2 illustrate this condition in FIG. 4.

Figure 5:
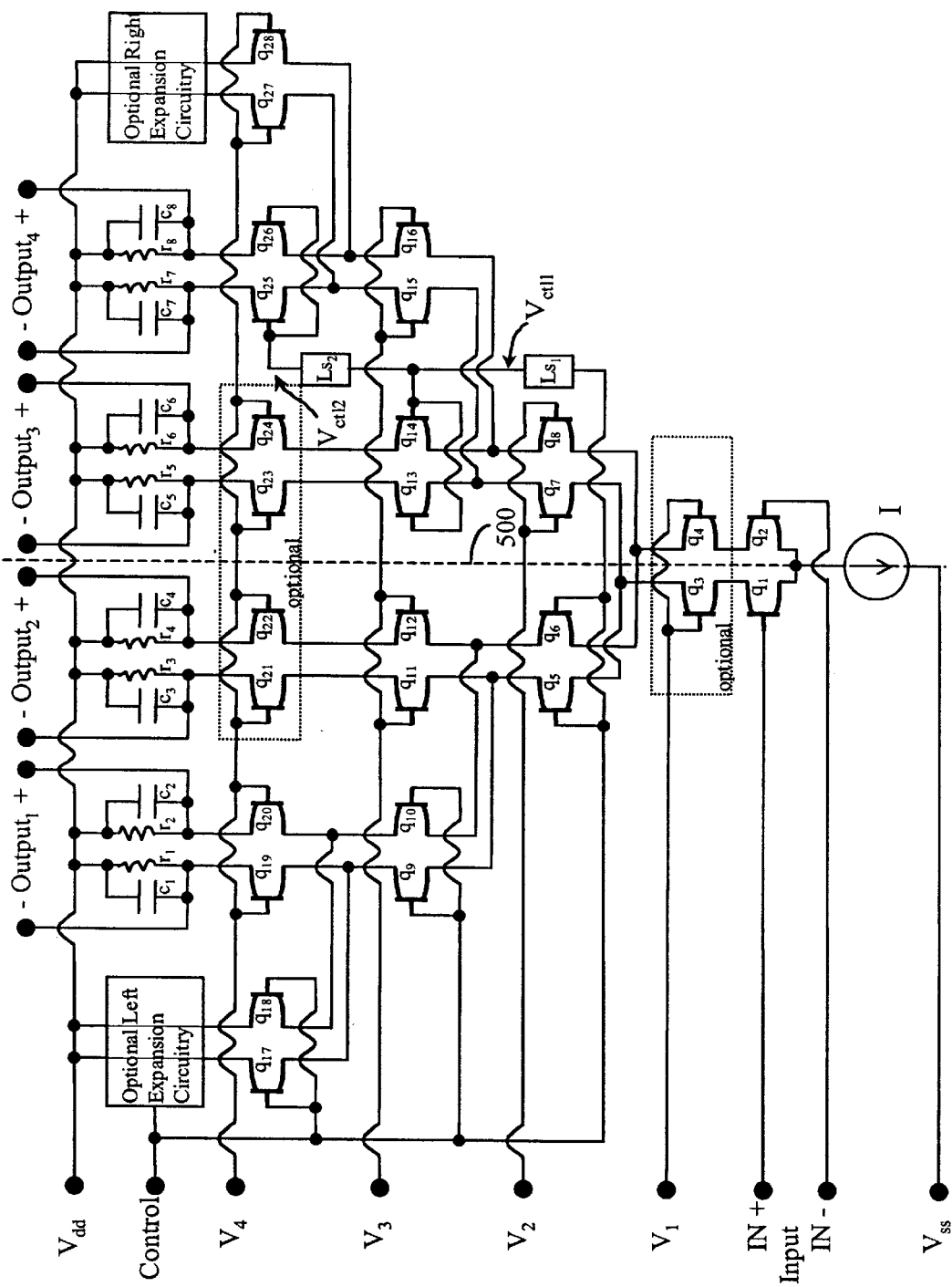
FIG. 5 is a schematic diagram of a four stage/channel integrated sampler circuit for acquiring multiple sequential samples.

Referring now to FIG. 5, a four-element serial sampler circuit (i.e., N=4) is illustrated. The circuit of FIG. 5 utilizes level shifting circuitry and can be further expanded by using optional left and right extension or expansion circuitry where identified. The extension or expansion circuitry is described and illustrated below in reference to FIG. 8.

The serial sampler circuit of FIG. 5 may be formed out of the transistors, resistors, capacitors and current sources as shown and illustrated. The serial sampler circuit of FIG. 5 may be defined or described in a number of ways.

The serial sampler circuit of FIG. 5 includes four serial sampler circuits. A first sampler circuitry includes the transistor pairs of q17/q18, q19/q20, q9/q10, and q11/q12 coupled together as shown and illustrated in FIG. 5. The second sampler circuitry includes the transistor pairs of q9/q10, q11/q12, q5/q6, and q7/q8 coupled together as shown and illustrated in FIG. 5. The third sampler circuitry includes the transistor pairs of q5/q6, q7/q8, q13/q14, and q15/q16, as well as a DC level shifter LS1 coupled together as shown and illustrated in FIG. 5. The fourth sampler circuitry includes the transistor pairs of q13/q14, q15/16, q25/q26, and q27/q28, as well as a DC level shifter LS2 coupled together as shown and illustrated in FIG. 5. Each sampler of FIG. 5 shares four transistors with each neighboring sampler similar to that of the circuit of FIG. 3.

Additionally, all samplers of FIG. 5 share the same input differential transistor pair q1/q2. The optional transistor pairs q21/q22 and q23/q24 may be used to provide frequency response matching of the different sampling channels. The transistor pair of q1/q2 comprise a differential input pair to sample an input signal or otherwise provide a level from which to generate samples.

Optional transistor pair q3/q4 may be provided to operate in a cascode mode and reduce a parasitic capacitive load that is seen by circuitry coupled to the Input. Thus, the transistor pair q3/q4 is often referred to as a cascode stage. The voltage V1 applied to the gates of transistors q3/q4 is used for biasing the cascode stage. The purpose of a cascode stage is to isolate the input transistors q1/q2 from switching transients generated by other transistors and to improve the high-frequency response of the input stage of input transistors q1/q2 by reducing a Miller Effect capacitance. Otherwise, the optional transistor pair q3/q4 may be eliminated and a short introduced across where their source and drain connections are made.

The DC level-shifting circuitry LS1 is used to create a signal (i.e., Vctl1) for the extinction of a sampling aperture at the end of State 3 and the initiation of another sampling aperture at the beginning of State 4. Vctl1 is coupled to the gates or control terminals of transistors q13 and q14. The DC level-shifting circuitry LS2 is used to create a signal (i.e., Vctl2) for the extinction of the sampling aperture at the end of State 4. Vctl2 is coupled to the gates or control terminals of transistors q25 and q26.

The serial sampler circuit of FIG. 5 can also be described around a centerline 500. The differential transistor pair q1/q2 may be used to define the centerline 500 of the serial sampler circuit with left sampler circuits to the left of the centerline and right sampler circuits to the right of the centerline. It is understood that the use of left and right is used herein for convenience only and may be used interchangeably. For an even number, the serial sampler circuit of FIG. 5A may be considered to have nearly an mirror image between the left circuits and the right circuits of the centerline but for differences in interconnections and level shifting elements.

The left sampler circuits to the left of the centerline 500 are located between the left outputs to the left of the centerline and the differential pair q1/q2 to sample the input signal Input. The first left sampler circuit to the left of the centerline 500 couples between the first left output (Output2) and the differential pair q1/q2. The second left sampler circuit to the left of the centerline couples between the second left output (Output1) and the first left sampler circuit. The concept of left sampler circuits may be extended to include i right sampler circuits.

The right sampler circuits to the right of the centerline 500 are located between the right outputs to the right of the centerline and the differential pair q1/q2 to sample the input signal Input. The first right sampler circuit to the right of the centerline 500 couples between the first right output (Output3) and the differential pair q1/q2. The second right sampler circuit to the right of the centerline couples between the second right output (Output4) and the first right sampler circuit. The concept of right sampler circuits may be extended to include j right sampler circuits.

The number of right sampler circuits (j) and left sampler circuits (i) on either side of the centerline 500 may be equivalent as illustrated in FIG. 5 in order to support an even number of sampling (i.e., N is even). Alternatively, the number of right sampler circuits (j) and left sampler circuits (i) on either side of the centerline 500 may be uneven in order to support an odd sampling number (i.e., N is odd). In the case of N samples and N sampler circuits, the reference voltages V2–V4 may be considered as N−1 reference voltages. If reference voltage V1 is included with optional transistor pair q3/q4 in the serial sampler circuit of FIG. 5, the reference voltages V1–V4 may be considered as N reference voltages.

In the right sampler circuits and the left sampler circuits, samples of the Input are generated at the right and left outputs respectively in response to a single transition in the control signal Control.

Figure 6:
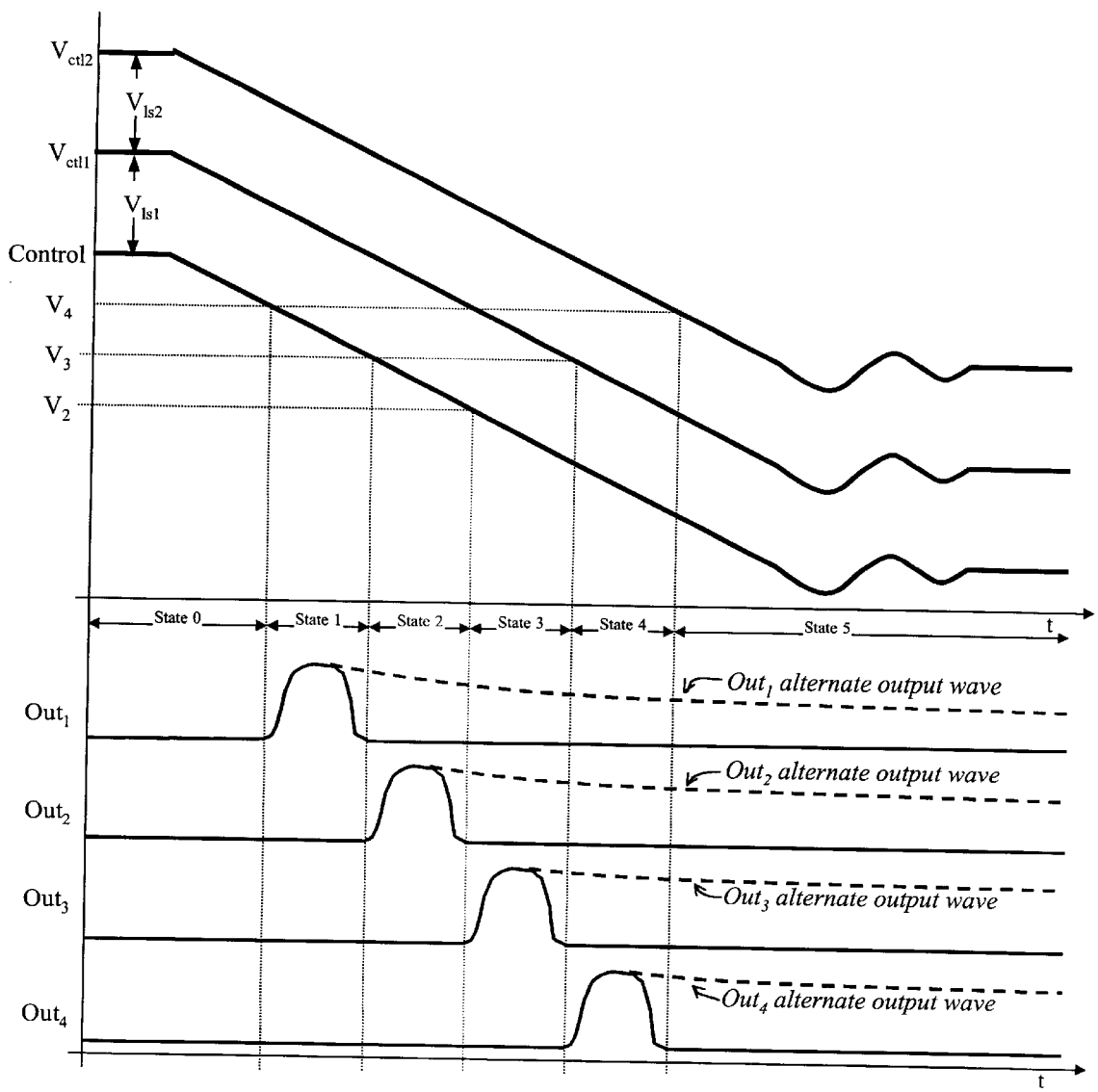
FIG. 6 is a wave form diagram illustrating the operation of the embodiment of the invention illustrated in FIG. 5.

Referring now to FIG. 6, a waveform diagram illustrates the operation of the serial circuit architecture of FIG. 5. FIG. 5 illustrates a waveform for the control signal Control, Vctl1, Vctl2, Out1, Out2, Out3, and Out4 versus time t. The waveform Out1 corresponds to Output1. The waveform Out2 corresponds to Output2. The waveform Out3 corresponds to Output3. The waveform Out4 corresponds to Output4. The waveforms Vctl1 and Vctl2 correspond to voltage shifted waveforms of that of the waveform of the control signal Control.

FIG. 6 also illustrates output waveforms for OUT1, OUT2, OUT3, and OUT4 by using dashed lines. Similar to FIG. 4, the dashed lines are the resultant output waveforms from the sampler circuit of FIG. 5 when used as a multiple sampler. The values of the sampled signals are desired to be held on the outputs OUT1, OUT2, OUT3, and OUT4 for an extended period of time. The alternate output waveforms may be achieved by increasing the resistance values of R1, R2, R3, R4, R5, R6, R7, and R8 and/or by increasing the capacitance values of capacitors C1, C2, C3, C4, C5, C6, C7, and C8. A time constant for the decay in the output may be determined by multiply the capacitance of the holding capacitors with the resistance values.

If the holding capacitors have a capacitance of zero or are removed and the resistors have low values, such as 50 ohms, the waveforms for the outputs resemble pulses as illustrated by the solid lines in the waveforms. If the capacitance of the holding capacitors and the resistance of the resistors have very high values, the output waveforms more resemble horizontal lines.

In practice, the output voltage values are not held indefinitely, even though the resistance of the resistors are increased to near infinity. This is due to leakage currents in the transistors. The droop in the alternate output waveforms illustrate this condition.

The operation of the circuit illustrated in FIG. 5 is an extension of the operation of the two-element sampler of FIG. 3. Given that V4>V3>V2>V1, control signal Control starts at a voltage level greater than V4 and slews in the negative direction to a voltage level less than V2. Vctl1 follows the waveform of the control signal Control, but shifted by the amount Vls1. That is, Vctl1=Control+Vls1. Vctl2 follows the waveforms of Vctl1 and the control signal Control, but level shifted therefrom. Vctl2 is shifted by the amount of Vls2 from Vctl1. Vctl2 is shifted by the amount of (Vls1+Vls2) from the control signal Control. That is, Vctl2=Control+Vls1+Vls2.

The circuit of FIG. 5 exhibits six distinct states as depicted in FIG. 6. The six distinct states are referred to herein as State 0, State 1, State 2, State 3, State 4, and State 5.

In State 0, the control signal Control is at a voltage level greater than V4 and transistor pairs q17/q18, q9/q10, q5/q6, q3/q4 and q1/q2 are turned "on" so that the current generated by the current source I can flow through them. Transistor pairs q19/q20, q11/q12, q7/q8, q13/14, q15/q16, q25/q26, and q27/q28 of the serial sampler circuit of FIG. 5 are turned "off". If optional transistor pairs q21/q22 and q23/q24 are provided, they are turned "off" as well in State 0. None of the outputs, (i.e., Output1, Output2, Output3, and Output4), are affected by the state of the sampling gates or transistors q1, q2 because at least one transistor pair is turned off there between. In State 0 all sampling gates may be considered to be effectively "off" because there is essentially no current flow from the input pair of transistors q1, q2 to any output. In the circuit of FIG. 5, the current flow in State 0 is from Vdd through transistor pairs q17/q18, q9/q10, q5/q6, q3/q4 (if any), q1/q2, and the current source I into Vss, effectively bypassing the outputs.

As the control signal Control falls to a voltage level below V4 but greater than V3, referred to as State 1, transistors q17/q18 turn "off" and transistors q19/q20 turn "on". The other transistors of the circuit of FIG. 5 remain in the same condition (on or off) as they were in State 0. In State 1 with transistors q19/q20 turned "on", the first sampling gate is opened, connecting the input pair of transistors q1/q2 to the output terminals of Output1. This opens or initiates a first sampling aperture, as illustrated in the waveform Out1 of FIG. 6.

As the control signal Control continues to fall to a voltage less than V3 but greater than V2, referred to as State 2, transistors q9/q10 turn "off" and transistors q11/q12 turn "on". In State 2 with transistors q9/q10 turned "off", the first sampling gate is closed, generating a high impedance between the input pair of transistors q1/q2 and the output terminals of Output1. This closes or extinguishes the first sampling aperture as illustrated in the waveform Out1 of FIG. 6. In State 2 with transistor pairs q5/q6, q11/q12, and optional transistor pair q21/q22 turned "on", the second sampling gate is opened, connecting the input pair of transistors q1/q2 to the output terminals of Output2. This opens or initiates a second sampling aperture, as illustrated in the waveform Out2 of FIG. 6, generating a low impedance between the input pair of transistors q1/q2 and the output terminals of Output2.

As the control signal Control continues to fall to a voltage less than V2 but greater than (V3−Vls1), referred to as State 3, transistors q5/q6 turn "off" and transistors q7/q8 turn "on". In State 3 with transistors q5/q6 turned "off", the second sampling gate is closed, generating a high impedance between the input pair of transistors q1/q2 and the output terminals of Output2. This closes or extinguishes the second sampling aperture as illustrated in the waveform Out2 of FIG. 6. In State 3 with transistor pairs q7/q8, q13/q14, and optional transistor pair q23/q24 turned "on", the third sampling gate is opened, connecting the input pair of transistors q1/q2 to the output terminals of Output3. This opens or initiates a third sampling aperture, as illustrated in the waveform Out3 of FIG. 6, generating a low impedance between the input pair of transistors q1/q2 and the output terminals of Output3.

As the control signal Control continues to fall to a voltage less than (V3−Vls1) but greater than (V4−Vls2−Vls1), referred to as State 4, transistors q13/q14 turn "off" and transistors q15/q16 turn "on". In State 4 with transistors q13/q14 turned "off", the third sampling gate is closed, generating a high impedance between the input pair of transistors q1/q2 and the output terminals of Output3. This closes or extinguishes the third sampling aperture as illustrated in the waveform Out3 of FIG. 6. In State 4 with transistor pairs q7/q8, q15/q16, and q25/q26 turned "on", the fourth sampling gate is opened, connecting the input pair of transistors q1/q2 to the output terminals of Output4. This opens or initiates a fourth sampling aperture, as illustrated in the waveform Out4 of FIG. 6, generating a low impedance between the input pair of transistors q1/q2 and the output terminals of Output4.

As the control signal Control continues to fall to a voltage level less than (V4−Vls2−Vls1), referred to as State 5, transistors q25/q26 turn "off" and transistors q27/q28 turn "on". In State 5 with transistors q25 and q26 turned "off", the fourth sampling gate is closed, generating a high impedance between the input pair of transistors q1/q2 and the output terminals of Output4. This closes or extinguishes the fourth sampling aperture as illustrated in the waveform Out4 of FIG. 6. In State 5, the current flows through transistor pairs q27/q28, q15/q16, q7/q8, q3/q4 (if any), and q1/q2 which are turned "on" and the current source I. Except for possible leakage currents, current does not flow to or from any output (i.e., Output1 or Output2, Output3, Output4).

Figure 7:
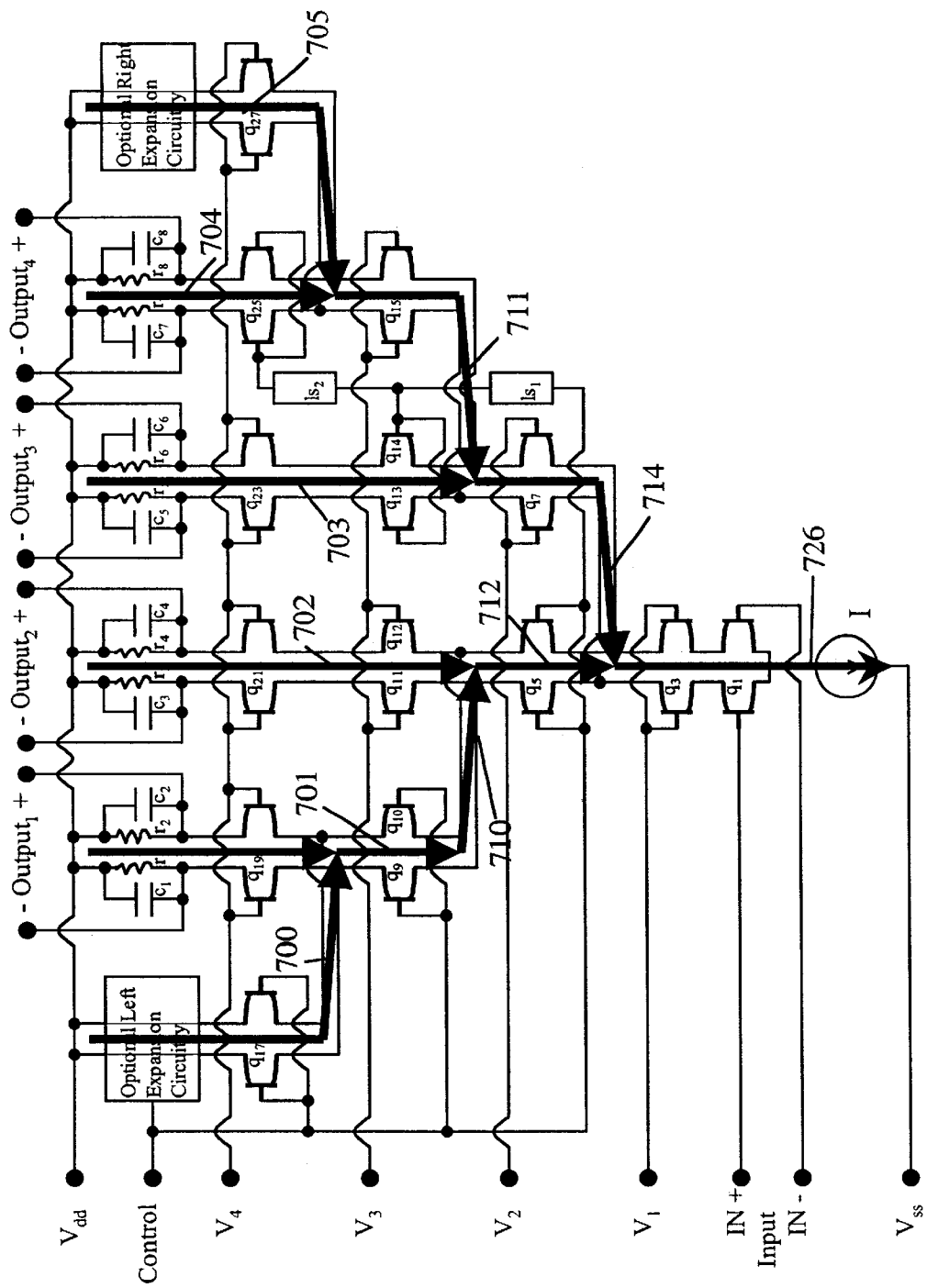
FIG. 7 is a diagram illustrating a shifting conduction path and current flow through the circuit of FIG. 5 as a control signal transitions.

Referring now to FIG. 7, a diagram of the current flow in the circuit of FIG. 5 is illustrated. During operation as the control signal changes through each of the six sequential states, States 0–State 5, the current flow in the circuit of FIG. 5 is a "single changing current path". Given matched transistors, the bias current through the input pair of transistors q1 and q2 does not change. Only the current path that feeds the input pair of transistors q1 and q2 changes as the state advances from State 0 to State 5 in response to the control signal Control falling.

In State 0, the current path is indicated by the current arrows 700, 710, 712, and 726. In State 1, the current path is indicated by the current arrows 701, 710, 712, and 726. In State 2, the current path is indicated by the current arrows 702, 712, and 726. In State 3, the current path is indicated by the current arrows 703, 714, and 726. In State 4, the current path is indicated by the current arrows 704, 711, 714, and 726. In State 5, the current path is indicated by the current arrows 705, 711, 714, and 726.

Figure 8:
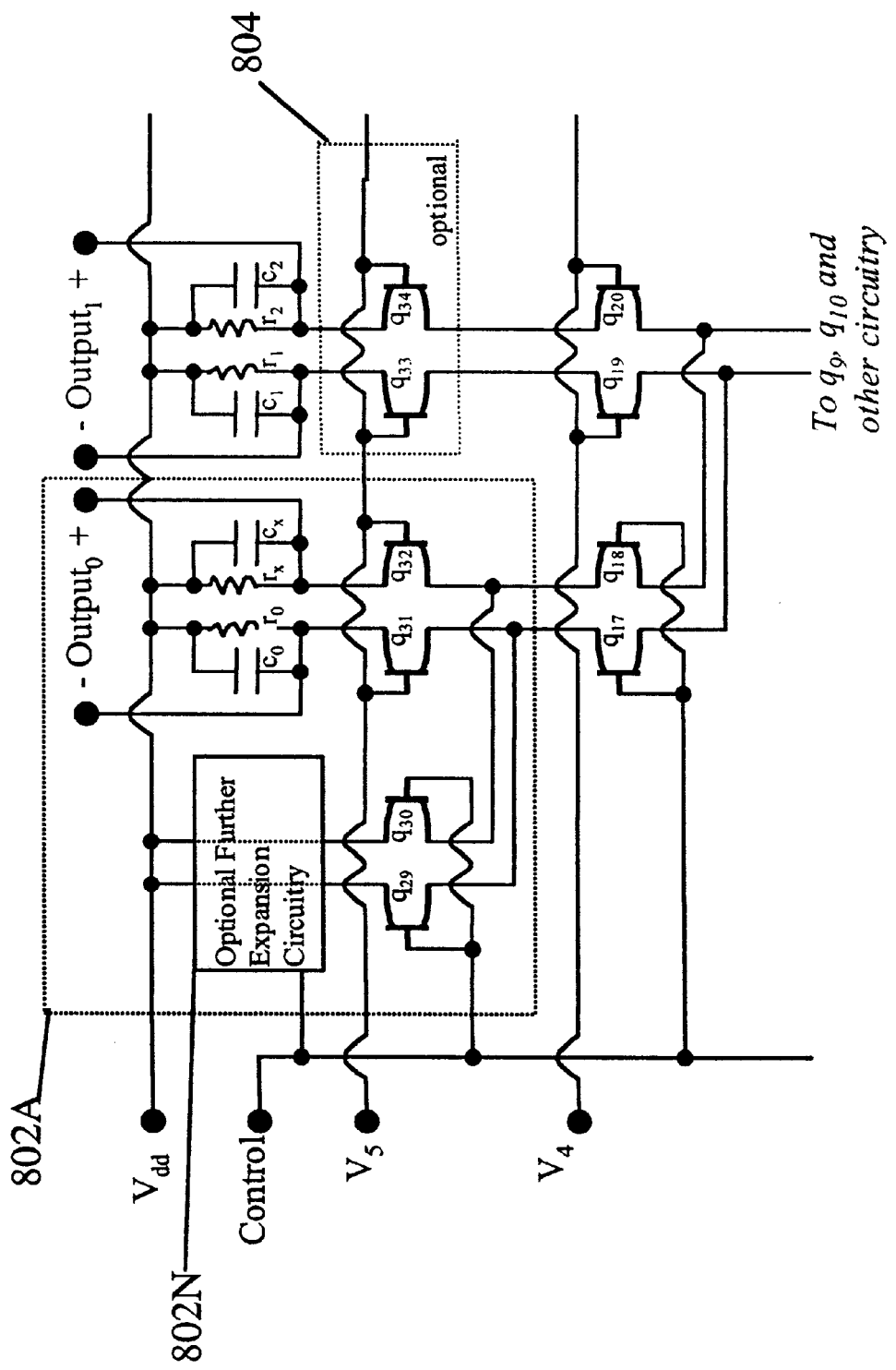
FIG. 8 is a schematic diagram illustrating channel expansion using optional extension circuitry.

Referring now to FIG. 8, the optional left extension or expansion circuitry identified in the circuit of FIG. 5 is illustrated. Without the optional left extension circuitry, sources of transistors q17 and q18 couple to Vdd. The optional right extension or expansion circuitry is a mirror image of the optional left extension or expansion circuitry and located on the right side of the circuit. Without the optional right extension circuitry, sources of transistors q27 and q28 couple to Vdd. When using any optional left or right extension or expansion circuitry, additional DC level-shifting circuitry may be required. The optional left/right extension circuitry and any further DC level-shifting circuitry is not illustrated in FIG. 5 for reasons of clarity.

In FIG. 8, an additional state and sampling aperture is added to the circuit of FIG. 5. FIG. 8 illustrates the expansion circuitry 802A of transistor pairs q29/q30 and q31/32 and the output terminals of Output0 having the resistors r0 and rx and the capacitors c0 and cx coupled together as shown and illustrated to Vdd, the control signal Control, and the transistor pair q17/q18. A new voltage level V5 is introduced so that V5>V4>V3>V2>V1.

An optional transistor pair 804 having a transistor pair q33/q34 is optionally added between transistor pair q19/q20 and Output1 to provide frequency response matching of the different sampling channels. These optional transistor pairs 804 may also be inserted between transistor pairs q21/q22, q23/q24, and q25/q26 and the corresponding outputs.

If further expansion of the sampler circuit is desired, further expansion circuitry 802N can be similarly added to connect to the transistor pair q29/q30. The optional expansion circuitry 802N includes similar elements to the optional expansion circuitry 802A. The optional expansion circuitry 802N may be further added to the right or left sampler circuits to further expand the serial sampler and the number of output samples N that it may generate.

In FIGS. 3–8 various embodiments of serial sampler circuits were disclosed to generate apertures in which multiple samples of an input are serially or sequentially taken. Embodiments of serial pulser circuits are now disclosed to generate multiple pulses in an output waveform.

As discussed previously, serial aperture/pulse generators do not enjoy the symmetry (dual use) of parallel implementations such as those of FIG. 2B. Under the constraint that only a single pulse be active at any one time, a serial pulser architecture can be constructed, with savings in transistor count and power requirements when compared to parallel implementation. The embodiments of serial pulser circuits are somewhat similar to the embodiments of the serial sampler circuits. However, rather than having multiple outputs, serial pulser circuits have a single output. Additionally, serial pulser circuits may have multiple inputs rather than the single input of serial sampler circuits.

Figure 9:
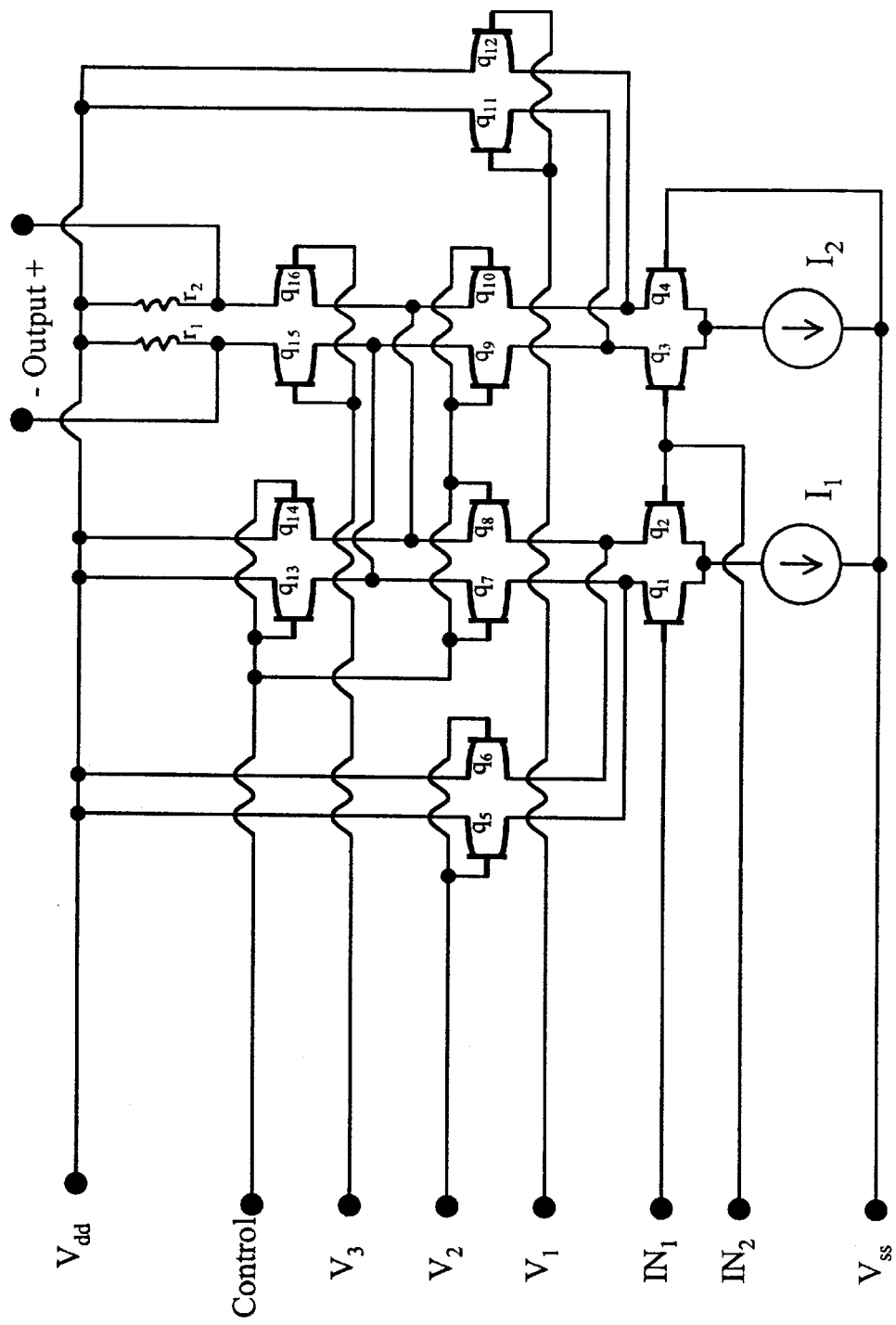
FIG. 9 is a schematic diagram illustrating a dual sequential pulse generator triggered by an edge of a single control signal.

Referring now to FIG. 9, a simple embodiment of a serial pulser circuit is illustrated. In the circuit of FIG. 9, N=2. That is, two pulses are generated in the output waveform for each edge of the control signal Control. As with the serial sampler, the extinction of the first pulse occurs simultaneous to the initiation of the second pulse. In FIG. 9, the serial pulser circuit includes transistors q1–q16, resistors r1–r2, and current sources I1–I2 coupled together as shown and illustrated. The serial pulser circuit may receive inputs IN1 and IN2, control signal Control, power supply voltages Vdd and Vss, and voltage levels V1, V2, and V3 connected to the circuitry as shown and illustrated. The serial pulser circuit may generate an output waveform across the plus and minus output terminals of the Output. Current sources I1 and I2 can each generate a similar current I.

The amplitude of the output pulses generated at the terminals of the Output are a function of the overall gain k of the serial pulser circuit and the voltage levels applied to the inputs IN1 and IN2. With IN2>IN1, one pulse level is approximately k*IN2 while another pulse level is approximately k*IN1.

The voltage levels V1, V2, and V3 are used to establish when the pulses are to occur and their periods or pulse widths as the control signal Control is swept or slewed. In one embodiment, the control signal Control slews negatively while in another embodiment, the control signal Control may slew positively. In the case that the control signal Control slews negatively, it begins from an initial voltage higher than V3 and slews negatively over time to a final voltage lower than V1.

Figure 10:
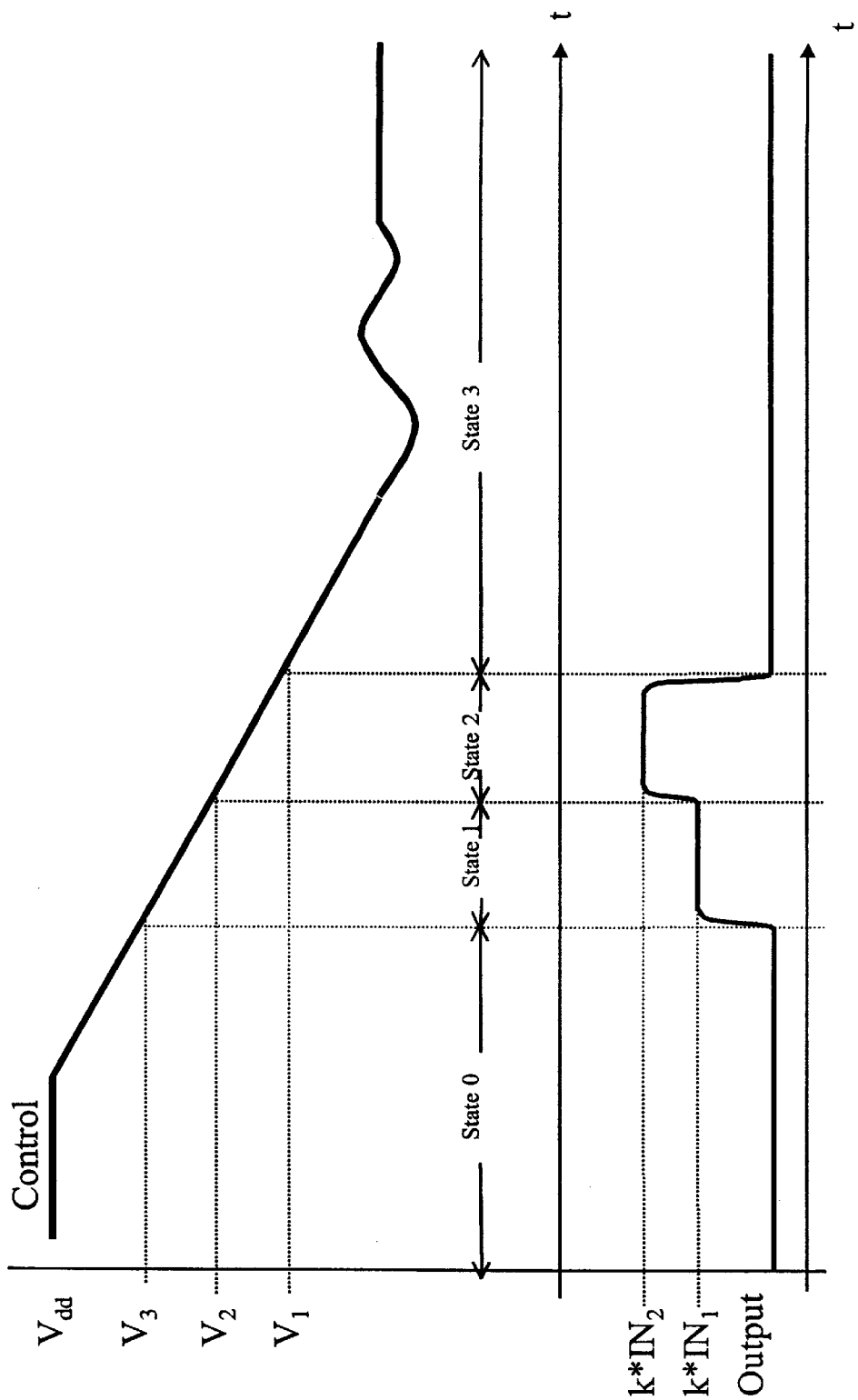
FIG. 10 is a wave form diagram illustrating the operation of the embodiment of the invention illustrated in FIG. 9.

Referring now to FIG. 10, a waveform diagram illustrates the operation of the serial pulser circuit architecture of FIG. 9. FIG. 10 illustrates a voltage waveform for the control signal Control versus time t and a current waveform for the Output versus time t. The voltage levels V1, V2, V3 are also illustrated on the Y axis of the waveform diagram to refer to voltage levels of the Control waveform and define the sequential states of the circuit. The current levels k*IN1 and k*IN2 are also illustrated on the Y axis of the waveform diagram to refer to the current levels of the pulses in the Output waveform.

Operation of the serial pulser circuit of FIG. 9 is similar to the operation of the serial sampler circuit of FIG. 3. As the control signal Control is swept or slewed, the serial pulser circuit of FIG. 9 progresses through four states. The four states are referred to as State 0, State 1, State 2, and State 3. FIG. 10 illustrates the four states in relationship to the Control and Output waveforms and the voltage levels of V1, V2, and V3. With V3>V2>V1 and Control starting greater than V3 and slewing in the negative direction to end at a voltage less than V1, the circuit of FIG. 9 progresses through the four states.

Referring now to both FIGS. 9 and 10, when Control is greater than V3, referred to as State 0, transistor pairs q13/q14, q7/q8, q9/q10, q1/q2, and q3/q4 are turned "on" to conduct current between their source and drain terminals. In State 0, transistor pairs q5/q6, q11/q12, and q15/q16 are turned "off" so that no other transistor pair is conducting current. That is, transistor pairs q5/q6, q11/q12, q15/q16 are not conducting current in State 0. The net result is that no current flows to or from the Output terminals in State 0 and the pulse generator or serial pulse circuit is essentially in an "off" state.

As the control signal Control slews so that its voltage falls to a voltage less than V3 but greater than V2, referred to as State 1, transistor pair q13/q14 turns "off" and transistor pair q15/q16 turns "on". This initiates the generation of a first pulse at the Output. In state 1, transistor pairs q7/q8, q9/q10, q1/q2, and q3/q4 remain turned "on". In state 1 with transistor pair q15/q16 turned "on", current begins flowing in a pair of current paths developed between the Output terminals and VSS through transistor pairs q15/q16, q9/q10, and q3/q4 and the current source I2 as well as through the transistor pairs q15/q16, q7/q8 and q1/q2 and the current source I1. This results in a voltage across the Output terminals being proportional to the differential current in the q1/q2 pair summed with the differential current in the q3/q4 pair.

The differential current in the q1/q2 pair is equal to a constant k times (IN1−IN2). The differential current in the q3/q4 pair is equal to the same constant k times IN2 because the control terminal or gate of transistor q4 is coupled to Vss. In State 1, the current flowing through the transistor pair q15/q16 is also the current flowing through the output resistors r1 and r2. In State 1, the current flowing through the transistor pair q15/q16 is the sum of the differential current in the q1/q2 pair and the differential current in the q3/q4 pair. Thus during State 1, the output current is equal to k times (IN1−IN2)+k times (IN2) which is equivalent to k*(IN1−IN2+IN2). This further reduces to k*IN1. In State 1 as illustrated in the current waveform of the Output in FIG. 10, the pulse generated in State 1 is proportional to k*IN1.

As the control signal Control slews so that its voltage falls to a voltage less than V2 but greater than V1, referred to as State 2, transistor pair q7/q8 turns "off" and transistor pair q5/q6 turns "on". This terminates or extinguishes the first pulse generated in the current waveform of the Output as illustrated in FIG. 10. The transistor pairs q15/q16, q9/q10, and q3/q4 remain turned "on" in State 2 to begin the generation or initiation of the second pulse in the current waveform of the Output as illustrated in FIG. 10.

With transistor pair q7/q8 turned "off" and transistor pair q5/q6 turned "on" in State 2, the current through the transistor pair q1/q2 does not affect the current and voltage at the Output terminals. The current through the transistor pair q1/q2 is routed between Vdd and Vss by the current path of transistors pairs q5/q6 and q1/q2 and the current source I1.

In state 2 with transistor pairs q15/q16, q9/q10, and q3/q4 remaining turned "on", current continues to flow in the current path between the Output terminals and VSS through transistor pairs q15/q16, q9/q10 and q3/q4 and the current source I2. No other current path affects the voltage or current at the Output terminals during State 2 of the serial pulser circuit of FIG. 9. Thus in State 2, the current at the Output terminals is simply k times IN2 or k*IN2. In State 2 as illustrated in the current waveform of the Output in FIG. 10, the pulse generated in State 2 is proportional to k*IN2.

As the control signal Control slews so that its voltage falls to a voltage less than V1, referred to as State 3, transistor pair q9/q10 turns "off" and transistor pair q11/q12 turns "on". This redirects current flow in transistor pair q9/q10 to begin flowing through transistor pair q11/q12. This terminates or extinguishes the second pulse generated in the current waveform of the Output as illustrated in FIG. 10.

With transistor pair q9/q10 turned "off" and transistor pair q11/q12 turned "on" in State 3, the current through the transistor pair q3/q4 does not affect the current and voltage at the Output terminals. Effectively current flow through the transistor pair q3/q4 does not reach the Output terminals to have an effect on the Output voltage or current during State 3 of the serial pulser circuit of FIG. 9. The current through the transistor pair q3/q4 is routed between Vdd and Vss by the current path of transistors pairs q11/q12 and q3/q4 and the current source I2. Thus during State 3, the current at the Output terminals is reduced to zero as illustrated in FIG. 10.

Thus in response to a single negative-going transition of the control signal Control and the inputs IN1 and IN2, the serial pulser circuit of FIG. 9 generates a first pulse proportional to IN1 followed sequentially by a second pulse proportional to IN2.

As discussed previously, the serial pulser circuit of FIG. 9 has N=2 so that it generates two sequential pulses. It is obvious that the circuitry of FIG. 9 may be extended to provide a larger number (i.e., N>2) of sequential output pulses without illustration. For example, a pulse generator with four sequential output pulses (i.e., N=4) can be constructed by connecting in parallel the output terminals of two serial pulser circuits that can generate two sequential output pulses, each like that of FIG. 9. The first instance of the serial pulser circuit is connected to input voltages IN1 and IN2, and pulse setting voltages V3, V2 and V1. The second circuit serial pulser circuit is connected to differing input voltages IN1a and IN2a, and differing pulse setting voltages V3a, V2a and V1a, where typically V3a is equal to or less than V1, V2a is less than V3a, and V1a is less than V2a. That is V3>V2>V1≧V3a>V2a>V1a. The input voltages IN1 and IN2 and IN1a and IN2a determine the amplitude of the Output pulses.

Figure 11:
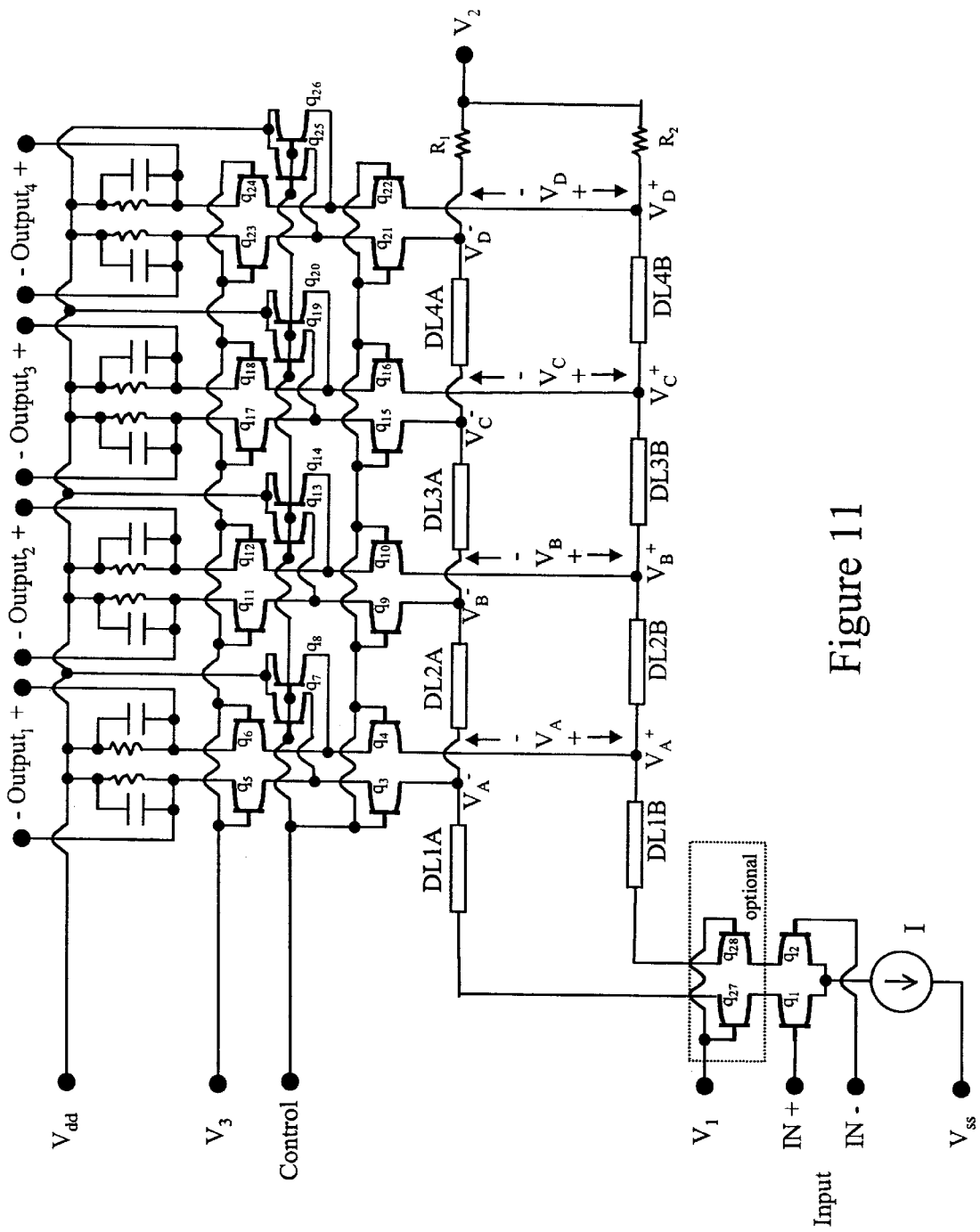
FIG. 11 is a schematic diagram of a four stage/channel integrated sampler circuit using fewer transistors and less power.

Referring now to FIG. 11, another embodiment of a serial sampler circuit architecture is illustrated. This serial sampler circuit includes the elements coupled together as shown and illustrated in FIG. 11. The serial sampler circuit of FIG. 11 uses less power and fewer transistors than the parallel sampler circuit of FIG. 2B. The serial sampler circuit of FIG. 11 is an extension of the circuit illustrated in FIG. 1. The serial sampler circuit of FIG. 11 generally speaking uses N instances of the top portion (i.e., transistors q5–q10) of the circuit of FIG. 1 which are combined together with a common input stage and delay line chain to produce a serial sampler circuit capable of acquiring N sequential samples. The resultant serial sampler circuit may use only 3N+1 transistor pairs, in contrast to the 5N transistor pairs required by the circuit of FIG. 2B. Note that the "lower portion" (q11/q12) of the sampler circuit of FIG. 1 is not used in the sampler circuit of FIG. 11. The equivalent of the biasing of the transistors to V2 in FIG. 1 is provided by resistors R1 and R2 in conjunction with a serial string of differential delay lines in the circuit of FIG. 11.

The serial sampler circuit of FIG. 11 utilizes a common input stage comprised of conventional differential transistor pair consisting of q1 and q2, whose common sources are connected to a current sink or current source I. Cascode circuitry, implemented by the transistor pair q27/q28 may optionally be included in the serial sampler circuit of FIG. 11. The cascade circuitry isolates the input pair from the switching transients of other transistors in the circuit. Thus, with the cascade circuitry there is less "kick-out" voltage at the input. Additionally, the cascade circuitry can also improve the high-frequency response of the input stage, due to the reduction of Miller-Effect capacitance.

The control terminal or gate of transistor q1 is coupled to the input IN+. The control terminal or gate of transistor q2 is coupled to the input IN−. The drains of q1 and q2, which generate a differential output signal proportional to the difference between inputs IN+ and IN−, are coupled into the serial string of differential delay lines DL1A/DL1B, DL2A/DL2B, DL3A/DL3B and DL4A/DL4B. Each individual delay line is an analog delay line to accurately delay an input signal and propagate it forward to its output. The serial string of differential delay lines DL1A/DL1B, DL2A/DL2B, DL3A/DL3B and DL4A/DL4B are terminated at an opposite end to the pulse setting voltage V2 through resistors R1 and R2 as shown in FIG. 11.

One terminal of resistors R1 and R2 couple to an end of the serial string of differential delay lines while a second terminal of resistors R1 and R2 couple to the pulse setting voltage V2. Resistors R1 and R2 may both have an identical resistance value that is matched to the characteristic impedance of one differential delay line in the serial string of differential delay lines to which they couple, so as to provide proper termination of the serial string of delay lines. Typically resistors R1 and R2 would each have a resistance between 25 and 75 ohms.

The serial string of differential delay lines DL1A/DL1B, DL2A/DL2B, DL3A/DL3B and DL4A/DL4B forms common-mode voltages at an end of each individual delay line. Referring to FIG. 11, common-mode voltage signals VA−/VA+, VB−/VB+, VC−/VC+, and VD−/VD+ are formed by the serial string of differential delay lines DL1A/DL1B, DL2A/DL2B, DL3A/DL3B and DL4A/DL4B, respectively as illustrated.

The pulse setting voltage V2 is fixed and serves to bias the common-mode voltages of the signals VA+, VA−, VB+, VB−, VC+, VC−, VD+ and VD− along the serial string of differential delay lines. The signals VA+ and VA− have a common mode voltage of V2−(0.5×I×R1), where I is the sink current of current source I, and R1 has the same resistance as R2. Additionally, the differential voltage, VA+ minus VA−, is proportional to IN+ minus IN−, but delayed by a time of $D_{DLIN}+D_{AMP}$, where $D_{AMP}$ is the delay introduced by the amplifier stage comprised of q1 and q2, and $D_{DLIN}$ is the delay deliberately introduced by the differential delay line comprised of DL1A and DL1B.

The pulse setting voltage V2 is fixed typically between 1 and 3 volts. $D_{AMP}$ typically has a value between 5 picoseconds and 200 picoseconds. The delay deliberately introduced by the differential delay, $D_{DLIN}$, may be chosen to be between 10 picoseconds and 100 nanoseconds.

Figure 12:
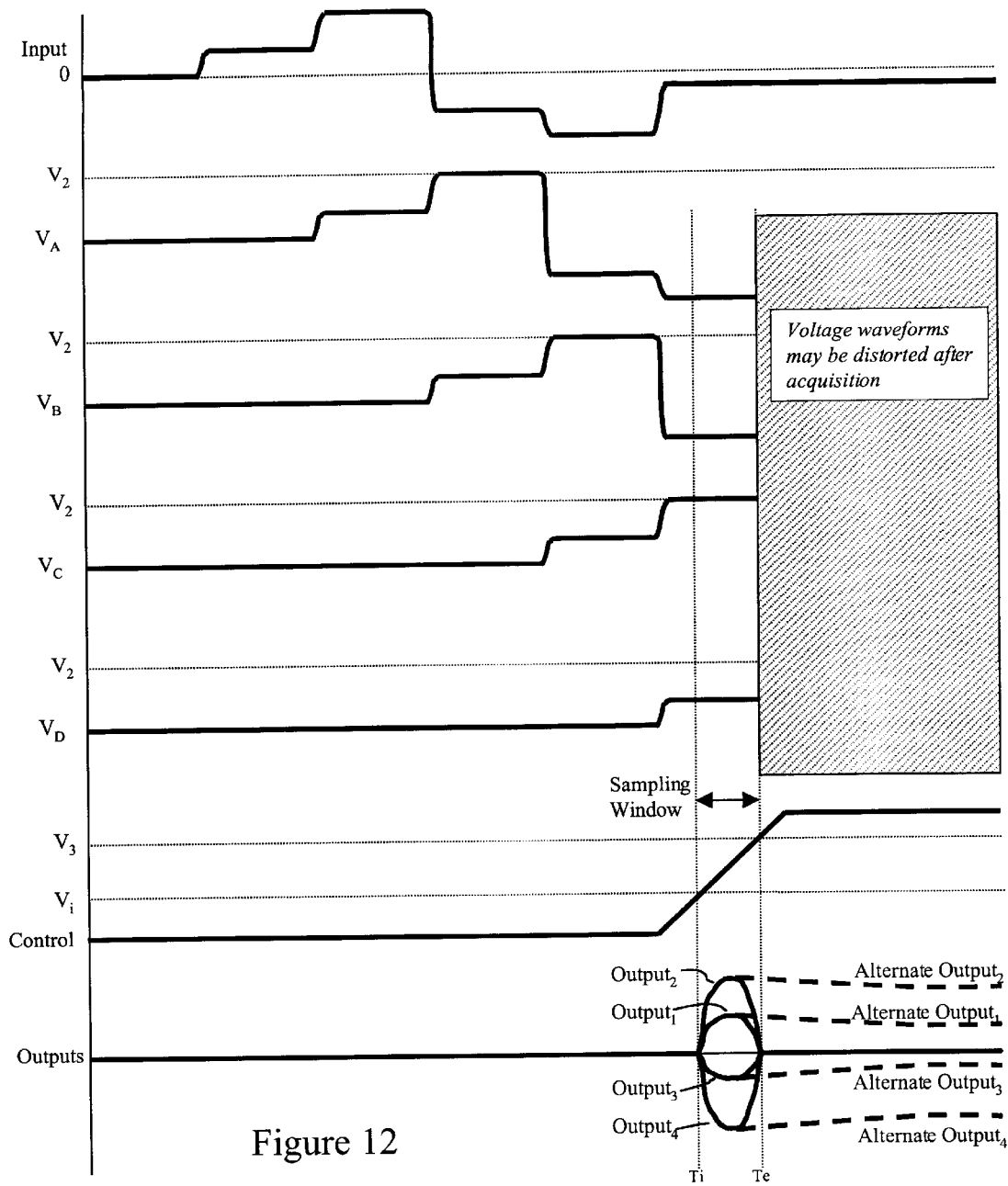
FIG. 12 is a wave form diagram illustrating the operation of the embodiment of the invention illustrated in FIG. 11.

In a similar manner, signals VB+ and VB− have a common mode voltage of slightly less than V2, just as VA+ and VA− do. However, the differential voltage, VB+ minus VB−, is delayed from VA+ and VA− by an additional time of $D_{DLIN}$, where $D_{DLIN}$ is the delay deliberately introduced by the differential delay line comprised of DL2B and DL2A respectively. In a similar manner, delay lines DL3A/DL3B result in signals VC− and VC+0 being further delayed by an additional time $D_{DLIN}$. Similarly, delay lines DL4A/DL4B cause signals VD− and VD+ being delayed by yet another time $D_{DLIN}$, as shown in FIG. 12.

In this manner the serial string of differential delay lines results in four differential signals, VA−/VA+, VB−/VB+, VC−/VC+, and VD−/VD+, each proportional to IN+ minus IN−, but sequentially delayed in time there from. Thus the serial string of differential delay lines facilitates the sequential sampling in time of an input differential signal, by providing sampling points for an incrementally delayed input differential signal.

For example, in a circuit designed to acquire four sequential samples of an analog signal at a 20 gigasample per second rate, each differential signal would be delayed 50 picoseconds from its predecessor to facilitate the sequential sampling in time of the input differential signal. That is, the circuit of FIG. 11 would take four samples within two hundred picoseconds in order to provide a twenty gigasample per second rate.

The process of acquiring the sequence of four samples in the embodiment of the series sampling circuit of FIG. 11 is performed by four identical samplers in response to a rising control signal, "Control". Each of the four identical samplers includes three transistor pairs.

The first sampler in FIG. 11 to generate Output1 is comprised of transistor pairs q3/q4, q5/q6 and q7/q8. The second sampler in FIG. 11 to generate Output2 is comprised of transistor pairs q9/q10, q11/q12 and q13/q14. The third sampler in FIG. 11 to generate Output3 is comprised of transistor pairs q15/q16, q17/q18 and q19/q20. The fourth sampler in FIG. 11 to generate Output4 is comprised of transistor pairs q21/q22, q23/q24 and q25/q26. These transistor pairs in each sampler provide similar functionality to the corresponding transistor pairs q5/q6, q7/q8 and q9/q10 respectively in the circuit of FIG. 1.

Referring now to FIG. 12, a waveform diagram illustrates exemplary operation of the serial pulser circuit architecture of FIG. 11 and its signals during the sampling process. FIG. 12 illustrates voltage waveforms for the control signal Control, Input, VA, VB, VC, and VD versus time t. FIG. 12 further illustrates a current waveform for the Outputs (i.e., Output1, Output2, Output3, and Output4 superimposed together) versus time t. The voltage level V2 is also illustrated on the Y axis of the waveform diagrams of VA+, VB+, VC+, and VD+. The voltage levels V3 and Vi are also illustrated on the Y axis of the Control waveform and to define the sampling window of the circuit. The time Ti indicates the initiation of sampling window and the time Te indicates the extinction of the sampling window. In the serial pulser circuit architecture of FIG. 11 sampling is initiated by a rising control signal Control, though a falling edge would also create the sampling apertures desired.

The control signal Control starts from a voltage that is at least less than V2−(I×R1). At the starting voltage for the control signal Control, the transistor pair q3/q4 in the first sampler is turned "off", as is the corresponding transistor pairs q9/q10, q15/q16 and q21/q22 in the second, third, and fourth samplers, respectively. With these transistor pairs turned "off", there is no current flow or current path to the outputs Output1, Output2, Output3, and Output4. Thus, the serial pulser circuit of FIG. 11 does not sample at the starting voltage of the control signal Control.

In FIG. 12, the input terminal IN+ varies voltage level over time as an analog signal with the control signal Control at its starting voltage level. The variations in IN+ and IN− are transferred down the serial string of differential delay lines DL1A/DL1B, DL2A/DL2B, DL3A/DL3B and DL4A/DL4B. FIG. 12 illustrates the variations in the differential input signal Input being transferred to the differential-mode voltage signals VA, VB, VC, and VD along the serial string of differential delay lines.

The control signal Control begins to positively slew or rise from its starting voltage in order to sample the differential input signal, Input.

At a time Ti, sampling at each of the eight delay line signals VC+, VA−, VB+, VB−, VC+, VC−, VD+ and VD− is initiated as the voltage of the control signal Control rises to a voltage Vi of approximately one transistor threshold (typically −2V to +4V) above the respective delay line signal. In this case, transistor pairs q3/q4, q9/q10, q15/q16 and q21/q22 turn "on" and begin to conduct current in each of the respective four samplers.

The differential currents conducted through these the transistor pairs q3/q4, q9/q10, q15/q16 and q21/q22 from the respective delay line signals flow through the upper transistor pairs q5/q6, q11/q12, q17/q18 and q23/q24, respectively and into each respective output, Output1, Output2, Output3, and Output4. The holding capacitors at each output receives the charges within the respective current to form a voltage.

Finally at time Te, as the voltage of the control signal Control continues to rise to a level above voltage V3 (typically 3–5 volts), transistor pairs q7/q8, q13/q14, q19/q20 and q25/q26 begin to conduct current. The transistor pairs q7/q8, q13/q14, q19/q20 and q25/q26 begin to conduct current divert current away from the conducting pairs q5/q6, q11/q12, q17/q18 and q23/q24, respectively, thereby turning them "off". With the transistors pairs q5/q6, q11/q12, q17/q18 and q23/q24 turned "off", the sampling aperture is ended.

FIG. 12 illustrates the sampling window between Ti and Te for sampling the eight delay line signals VC+, VA−, VB+, VB−, VC+, VC−, VD+ and VD− along the delay line which are proportional to the Input. FIG. 12 further illustrates the sampled output within the sampling window for each respective output, Output1, Output2, Output3, and Output4 superimposed upon one another.

The output signal within the sampling window for each respective output, Output1, Output2, Output3, and Output4 represents the sampled values of VD=(VD+ minus VD−), VC=(VC+ minus VC−), VB=(VB+ minus VB−), and VA= (VA+ minus VA−), respectively. The sampled values of VD, VC, VB, and VA, are proportional to the differential input signal Input which equals IN+ minus IN−.

In the manner thus described, a sequence of four samples is simultaneously acquired of the input signal Input. Because the samples which are acquired concurrently are of four sequentially delayed versions of the input signal, they are equivalent to what would have been obtained by four independent samplers, each triggered sequentially.

The sampler circuit of FIG. 11 is for use in obtaining four samples at a time where N=4. However, the sampler circuit of FIG. 11 may be readily extended to a considerably larger number of samplers for taking more samples (i.e., N>4). One or more instances of the sampler circuit of the differential delay line DL1A/DL1B; transistor pairs q3/q4, q5/q6, q7/q8; Output1 terminal; and resistors and capacitors coupled to the Output1 terminal need only be added between resistors R1/R2 and the differential delay line DL4A/DL4B to extend the sampler circuit.

Furthermore, the differential sampler circuit of FIG. 11 can be obviously modified to a simpler single-ended (non-differential) version of the circuit. In which case, a single-ended delay line string may be used instead of the differential string shown, as well as a single transistor (the left transistor in each transistor pair for example) may be used instead of the differential transistor pairs.

The sampler circuit of FIG. 11 as illustrated has fewer transistors than that of four samplers made from the circuit of FIG. 1. Additionally, less current flows in the sampler circuit of FIG. 11, than that of a sampler circuit (N=4) composed of four samplers of the circuit of FIG. 1.

The sampler circuit of FIG. 11 has a couple of characteristics in its operation that should be noted. First, the control signal must rise sufficiently fast so that the sampling aperture time Ti minus Te is shorter than the delay line delays $D_{DLIN}$. Otherwise, the sampled signals may interfere with one another. In a sequential sampling system, such as a digital oscilloscope, this is satisfied because the sampling window is normally narrower than the time between successive samples, so as not to smear the values of the adjacent samples together.

Another characteristic of the sampling circuit of FIG. 11 is that as a group of samples is being acquired, the signals on the delay line string are corrupted by the fact that the string's impedance has been disturbed by turning on the transistor pairs during sampling. While this disturbance will not cause the samples to be erroneous, as the sampling is over before the disturbed signal has a chance to travel to the next node in the delay line, one should wait for a time period (typically at least two times the total delay line time $(N \times D_{DLIN})$) before taking another group of N samples. This normally would not be a problem in practical signal acquisition systems either, as they would normally be made of several strings of N samplers, that are used in a rotational sequence, so each N-sampler string would have plenty of time to recover before its turn came around again to acquire a sample group.

Figure 13:
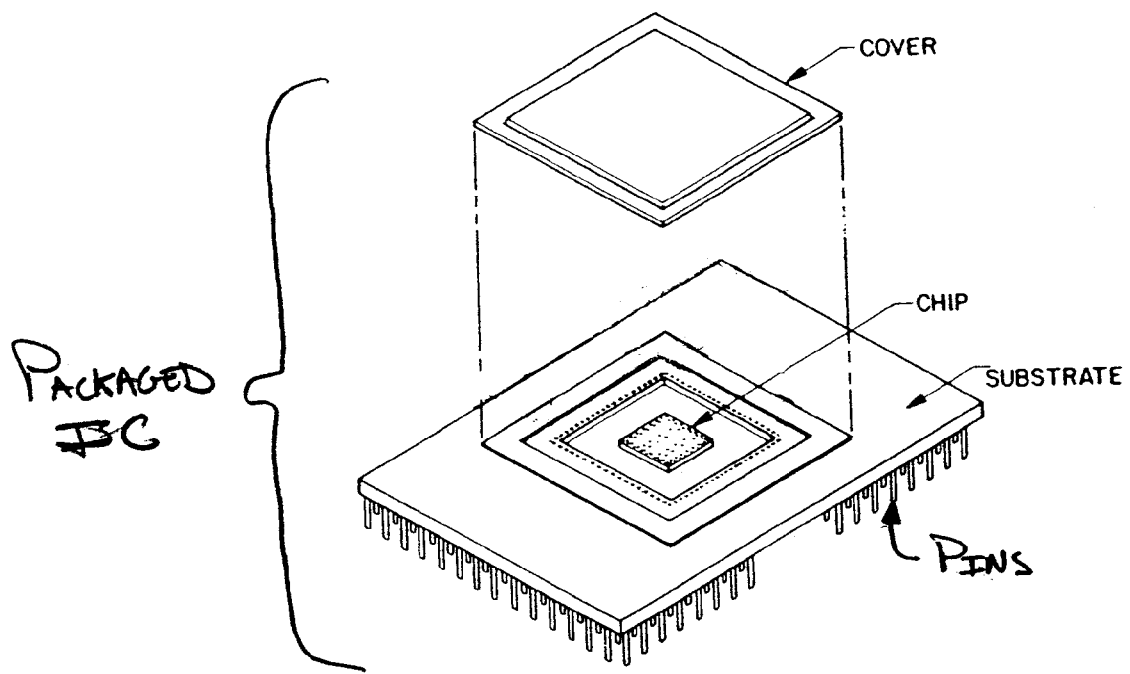
FIG. 13 is an exploded perspective view of an exemplary packaged monolithic integrated circuit which may include the circuits of the invention.

Referring now to FIG. 13, an exploded perspective view of an exemplary packaged integrated circuit (IC) is illustrated. The packaged IC may include a chip or integrated circuit, a substrate, a plurality of pins or leads, and a cover.

The chip may include the circuits described previously. The pins or leads of the packaged IC make electrical connections to the chip. The substrate provides support to the chip and facilitates the electrical connections between the chip and the pins or leads. The cover may be used to protect the chip and couples to the substrate covering an opening therein.

While only a single embodiment from the parent patent application Ser. No. 09/876,016 has been described as being adapted to support taking multiple samples and generating multiple pulses, the other embodiments of the parent patent application, application Ser. No. 09/876,016, can obviously also be adapted into circuit combinations to provide multiple samples of an input signal or multiple pulse generation in an output signal in accordance with the teachings herein.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art. For example, the invention has been described herein with reference to enhancement mode MESFETs corresponding to Gallium Arsenide (GaAs) technology. Other transistor types and semiconductor technologies may be used to implement the invention including NFETs, and/or PFETs corresponding to MOS technology or CMOS technology, PNP and/or NPN transistors of bipolar semiconductor technology as well as N-type and/or P-type FETs of a gallium-arsenide type, indium phosphide type or silicon-germanium type of semiconductor technology. Additionally, it may be possible to implement the invention or some of its features in hardware, firmware, software or a combination thereof where the software is provided in a processor readable storage medium such as a magnetic, optical, or semiconductor storage medium or the like.

What is claimed is:

1. A serial multiple sampler circuit comprising:
    a differential transistor pair having control terminals coupled to input terminals to receive a differential data input signal, the differential transistor pair jointly coupled to a current source at a first end;
    a first sampler circuitry coupled between a second end of the differential transistor pair and a first output, the first sampler circuitry to receive a sample control signal, a third voltage level, and a second voltage level, the first sampler circuitry including level activated switching elements responsive to the sample control signal and the third voltage level to couple a first sample of the differential data input signal to the first output; and
    a second sampler circuitry coupled between the second end of the differential transistor pair and a second output, the second sampler circuitry to receive the sample control signal, a second voltage level, and a first voltage level, the second sampler circuitry including level activated switching elements responsive to the sample control signal, the second voltage level, and the first voltage level to couple a second sample of the differential data input signal to the second output.

2. The serial multiple sampler circuit of claim 1 wherein, the first sampler circuitry to sample the differential data input signal when a voltage of the sample control signal is between the third voltage level and the second voltage level.

3. The serial multiple sampler circuit of claim 1 wherein, the second sampler circuitry to sample the differential data input signal when a voltage of the sample control signal is between the second voltage level and the first voltage level.

4. The serial multiple sampler circuit of claim 1 further comprising:
    a third sampler circuitry coupled to the second sampler circuitry at one end and a third output at an opposite end,
    a first level shifter to receive the sample control signal and generate a first level shifted sample control signal, and
    wherein
        the third sampler circuitry to receive the second voltage level and the first level shifted sample control signal, and
        the third sampler circuitry including level activated switching elements responsive to the first level shifted sample control signal and the second voltage level to couple a third sample of the differential data input signal to the third output.

5. The serial multiple sampler circuit of claim 4 further comprising
    a fourth sampler circuitry coupled to the third sampler circuitry at one end and a fourth output at an opposite end,
    a second level shifter to receive the first level shifted sample control signal and generate a second level shifted sample control signal, and
    wherein
        the fourth sampler circuitry to receive the third voltage level and the second level shifted sample control signal, and
        the fourth sampler circuitry including level activated switching elements responsive to the second level shifted sample control signal and the third voltage level to couple a fourth sample of the differential data input signal to the fourth output.

6. The serial multiple sampler circuit as in any of claims 1–5 wherein
    sample times at which each of the multiple samples is acquired are dynamically altered by dynamically modulating the first, second and third voltage levels.

7. The serial multiple sampler circuit of claim 1 wherein, the level switching elements are differentially paired transistors.

8. A serial multiple pulser circuit comprising:
    a first differential input stage having a first control terminal coupled to a first single-ended input and a second control terminal coupled to a second single-ended input, the first differential stage coupled to a first current source at one end;
    a second differential input stage having a first control terminal coupled to the first single-ended input and a second control terminal coupled to a low level power supply, the second differential stage coupled to a second current source at one end;
    a first differentially-paired-transistors (DPT) having control terminals coupled to a second voltage level, drain terminals coupled to a high level power supply, and source terminals coupled to the first differential input stage;
    a second DPT having control terminals coupled to a control signal, drain terminals coupled to the high level power supply, and source terminals coupled to a third DPT;
    the third DPT having control terminals coupled to the control signal, drain terminals coupled to the source terminals of the second DPT, and source terminals coupled to the first differential input stage;
    a fourth DPT having control terminals coupled to a third voltage level, drain terminals coupled to output terminals of an output, and source terminals coupled to the drain terminals of the third DPT, the source terminals of the second DPT, and drain terminals of a fifth DPT;
    the fifth DPT having control terminals coupled to the control signal, drain terminals coupled to the source terminals of the fourth DPT, and source terminals coupled to the second differential input stage; and
    a sixth DPT having control terminals coupled to a first voltage level, drain terminals coupled to a high level power supply, and source terminals coupled to the second differential input stage.

9. The serial multiple pulser circuit of claim 8 wherein,
    the control signal to activate the serial multiple pulser circuit to generate at a common set of output terminals a first pulse responsive thereto when a voltage level of the control signal is between the third voltage level and the second voltage level, and
    the control signal to activate the serial multiple pulser circuit to generate a second pulse on said common set of output terminals responsive thereto when a voltage level of the control signal is between the second voltage level and the first voltage level.

10. The serial multiple pulser circuit of claim 8 further comprising:
    a first resistor and a second resistor each having one end coupled to the high level power supply and an opposite end coupled to the output terminals of the output.

11. The serial multiple pulser circuit of claim 8 wherein, pulse widths of the pulses generated by the serial multiple pulser circuit are responsive to the first, second, and third voltage levels.

12. The serial multiple pulser circuit of claim 8 wherein starting times of the pulses generated by the serial multiple pulser circuit are responsive to the first, second and third voltage levels.

13. The serial multiple pulser circuit of claim 11 wherein, ending times of the pulses generated by the serial multiple pulser circuit are responsive to the first, second and third voltage levels.

14. The serial multiple pulser circuit of claim 13 wherein, the pulses generated by the serial multiple pulser circuit are time shifted by altering the first, second and third voltage levels.

15. The serial multiple pulser circuit of claim 8 wherein, starting times of the pulses are dynamically altered by dynamically modulating the first and second voltage levels.

16. The serial multiple pulser circuit of claim 8 wherein, amplitudes of the pulses generated by the serial multiple pulser circuit are responsive to voltage levels of the first input and the second input.

17. A multiple sampler circuit comprising:
a differential transistor pair having control terminals coupled to input terminals to receive a differential data input signal, source terminals jointly coupled to a current source at a first end, and drain terminals separately coupled to a serial string of differential delay lines at a second end opposite the first end;
the serial string of differential delay lines including a plurality of differential delay lines coupled in series together, the serial string of differential delay lines having a first end and a second end, the first end coupled to the differential transistor pair, the serial string of differential delay lines forming a plurality of delayed differential input signals each having a delay greater than the next;
a first resistor and a second resistor having first terminals coupled to the second end of the serial string of differential delay lines and second terminals coupled to a second voltage level; and
a plurality of sampler circuits coupled to the serial string of differential delay lines at one end and a plurality of output terminal pairs of a plurality of outputs at another end, the plurality of sampler circuitry to receive a control signal and a third voltage level.

18. The multiple sampler circuit of claim 17 wherein, each of the plurality of sampler circuits including
a first differentially-paired-transistors (DPT) having a pair of control terminals coupled to the control signal, a pair of source terminals coupled to a respective delayed differential input signal, a pair of drain terminals coupled to a pair of source terminals of a second DPT;
the second DPT having a pair of control terminals coupled to the third voltage level, a pair of drain terminals coupled to a pair of output terminals of a respective output, the pair of source terminals coupled to the pair of drain terminals of the first DPT; and
a third DPT having a pair of control terminals coupled to the control signal, a pair of drain terminals coupled to a high level power supply, a pair of source terminals coupled to the pair of source terminals of the second DPT and the pair of drain terminals of the first DPT.

19. The multiple sampler circuit of claim 17 wherein, the plurality of sampler circuits sample the respective delayed differential input signals when the control signal slews to a voltage level to turn on the first DPT in each respective sampler circuit of the plurality of sampler circuits.

20. The multiple sampler circuit of claim 17 wherein, each output terminal of the plurality of output terminal pairs of the plurality of outputs having one end of a resistor and a capacitor coupled thereto with an opposite end of the resistor and the capacitor coupled to the high level power supply.

21. The multiple sampler circuit of claim 17 further comprising:
the current source coupled to the differential transistor pair at a first end and a low level power supply at a second end opposite the first end.

22. The multiple sampler circuit of claim 17 further comprising:
a fourth differentially-paired-transistors (DPT) coupled between the differential transistor pair and the serial string of differential delay lines, the fourth DPT having a pair of control terminals coupled to a first voltage level, a pair of drain terminals coupled to the serial string of differential delay lines at a first end, a pair of source terminals coupled to the pair of drain terminals of differential transistor pair at a second end.

23. The multiple sampler circuit of claim 18 wherein, transistors of the differential transistor pair and the plurality of sampler circuits are transistors of one of Gallium Arsenide (GaAs) MESFET, GaAs Heterojunction Bipolar Transistor (HBT), GaAs High Electron Mobility Transistor (HEMT), Indium Phosphide (InP) transistor, Silicon-Germanium (SiGe), Silicon bipolar or MOS transistors.

24. A parallel multiple sampler circuit comprising:
a first sampler circuit coupled to one or more input terminals to receive an input signal and one or more output terminals of a first output to generate a first output signal thereon, the first sampler circuit to receive a sample control signal, a first voltage level, and a second voltage level, the first sampler circuit including level activated switching elements responsive to the sample control signal and the first and second voltage levels to couple a first sample of the input signal to the first output as the first output signal;
a second sampler circuit coupled in parallel with the first sampler circuit to the one or more input terminals to receive the input signal, the second sampler circuit further coupled to one or more output terminals of a second output to generate a second output signal thereon, the second sampler circuit to receive the sample control signal, a third voltage level, and a fourth voltage level, the second sampler circuit including level activated switching elements responsive to the sample control signal and the first and second voltage levels to couple a second sample of the input signal to the second output as the second output signal; and
wherein the sample control signal to slew over a voltage range to sequentially trigger sampling of the input signal by the first and second sampler circuits.

25. The parallel multiple sampler circuit of claim 24 wherein,
the first sampler circuit to sample the input signal when a voltage of the sample control signal is between the first voltage level and the second voltage level.

26. The parallel multiple sampler circuit of claim 25 wherein,
the second sampler circuit to sample the input signal when the voltage of the sample control signal is between the third voltage level and the fourth voltage level.

27. The parallel multiple sampler circuit of claim 25 wherein,
the second voltage level is equal to the third voltage level, and
the second sampler circuit to sample the input signal when the voltage of the sample control signal is between the second voltage level and the fourth voltage level.

28. The parallel multiple sampler circuit of claim 24 further comprising:
N sampler circuits coupled in parallel with the first sampler circuit and the second sampler circuit to the one or more input terminals to receive the input signal, the N sampler circuits further coupled to one or more output terminals of N outputs to generate N output signals thereon, each of the N sampler circuits to receive the sample control signal, an $(N+5)^{th}$ voltage level, and an $(N+6)^{th}$ voltage level, the N sampler circuits including level activated switching elements responsive to the sample control signal and the $(N+5)^{th}$ and $(N+6)^{th}$ voltage levels to couple an $N^{th}$ sample of the input signal to the $N^{th}$ output as the $N^{th}$ output signal; and
wherein the sample control signal to slew over a voltage range to sequentially trigger sampling of the input signal by the first, second, and N sampler circuits.

29. The parallel multiple sampler circuit of claim 24 wherein,
the level switching elements are differentially paired transistors.

30. The parallel multiple sampler circuit of claim 29 wherein,
the transistors are one of Gallium Arsenide (GaAs) MESFET, GaAs Heterojunction Bipolar Transistor (HBT), GaAs High Electron Mobility Transistor (HEMT), Indium Phosphide (InP) transistor, Silicon-Germanium (SiGe), Silicon bipolar or MOS transistors.

31. A multiple data sampling method comprising:
delaying an input data signal along a series of delay lines to generate a delayed sequence of input data signals;
providing a control signal changing from a first voltage level to a second voltage level;
simultaneously sampling the delayed sequence of input data signals in response to a change in the voltage level of the control signal between the first voltage level and the second voltage level; and
maintaining the samples of the delayed sequence of input data signals in response to the voltage level of the control signal being outside a range of voltage levels between the first voltage level and the second voltage level.

32. The method of claim 31 wherein,
the sampling of the data input signal initiates at a first switching point and ends at a second switching point between the range of voltage levels between the first voltage level and the second voltage level forming a sampling window.

33. A multiple data pulsing method comprising:
providing a control signal changing from a first voltage level to a second voltage level;
generating a series of a plurality of pulses in an output signal in response to a change in the voltage level of the control signal between the first voltage level and the second voltage level; and
maintaining a steady state in the output signal in response to the voltage level of the control signal being outside a range of voltage levels between the first voltage level and the second voltage level.

34. The method of claim 33 wherein,
the generating of a first pulse of the series of the plurality of pulses in the output signal initiates at a first switching point and ends at a second switching point between the range of voltage levels between the first voltage level and the second voltage level.

35. The method of claim 33 wherein,
the series of the plurality of pulses is non-overlapping.

36. The method of claim 33 wherein,
the series of the plurality of pulses is partially overlapping.

37. A multiple data sampling method comprising:
providing a control signal changing from a first voltage level to a second voltage level;
generating a series of a plurality of sampling apertures in a sampling circuit in response to a change in the voltage level of the control signal between the first voltage level and the second voltage level;
sequentially sampling an input signal in response to the series of the plurality of sampling apertures; and
generating a plurality of output signals in response to the sequential sampling of the input signal.

38. The method of claim 37 wherein,
the generating of a first sampling aperture initiates at a first switching point and ends at a second switching point between the range of voltage levels between the first voltage level and the second voltage level.

39. The method of claim 37 wherein,
the series of the plurality of sampling apertures is non-overlapping.

40. The method of claim 37 wherein,
the series of the plurality of sampling apertures is partially overlapping.

41. A multiple data sampling method in a circuit without differentiating circuit elements and without pulse reversing elements, the method comprising:
providing an electrical control signal;
generating a series of a plurality of sampling apertures in a sampling circuit, each sampling aperture having a starting time and an ending time, the series of the plurality of sampling apertures generated in response to a single transition of the electrical control signal.

42. The multiple data sampling method of claim 41 wherein,
the differentiating circuit elements are capacitors.

43. The multiple data sampling method of claim 41 wherein,
the pulse reversing elements are transmission lines.

44. The multiple data sampling method of claim 41 wherein,
the pulse reversing elements are delay lines.

45. A multiple pulse generating method in a circuit without differentiating circuit elements and without pulse reversing elements, the method comprising:

providing an electrical control signal;

generating a series of a plurality of output signals, each of the plurality of output signals having two transitions, and the series of the plurality of output signals generated in response to a single transition of the electrical control signal.

46. The multiple pulse generating method of claim 45 wherein, the differentiating circuit elements are capacitors.

47. The multiple pulse generating method of claim 45 wherein, the pulse reversing elements are transmission lines.

48. The multiple pulse generating method of claim 45 wherein, the pulse reversing elements are delay lines.

49. A serial multiple sampler circuit for taking N samples where N is greater than or equal to four, the serial multiple sampler circuit comprising:

at least N−1 reference voltage inputs to receive N−1 reference voltage levels;

a differential transistor pair having control terminals coupled to input terminals to receive a differential data input signal for sampling, the differential transistor pair jointly coupled to a current source at one end and forming a centerline of the serial multiple sampler circuit;

a first left sampler circuit to the left of the centerline coupled between the differential transistor pair and a first left output, the first left sampler circuit to receive at least one of the N−1 reference voltage levels and a sample control signal, the first sampler circuit including level activated switching elements responsive to the sample control signal and the at least one of the N−1 reference voltage levels to couple a sample of the differential data input signal to the first left output;

a first right sampler circuit to the right of the centerline coupled between the differential transistor pair and a first right output, the first right sampler circuit to receive at least one of the N−1 reference voltage levels and a first shifted sample control signal, the first right sampler circuit including level activated switching elements responsive to the first shifted sample control signal and the at least one of the N−1 reference voltage levels to couple a sample of the differential data input signal to the first right output, the first shifted sample control signal having a first level shift from the sample control signal;

an $i^{th}$ left sampler circuit to the left of the centerline coupled to the i−1 left sampler circuit and an $i^{th}$ left output, the $i^{th}$ left sampler circuit between the $i^{th}$ left output and the differential transistor pair, the $i^{th}$ left sampler circuit to receive at least one of the N−1 reference voltage levels and the sample control signal, the $i^{th}$ left sampler circuit including level activated switching elements responsive to the sample control signal and the at least one of the N−1 reference voltage levels to couple a sample of the differential data input signal to the $i^{th}$ left output;

a $j^{th}$ right sampler circuit to the right of the centerline coupled to the j−1 right sampler circuit and a $j^{th}$ right output, the $j^{th}$ right sampler circuit between the $j^{th}$ right output and the differential transistor pair, the $j^{th}$ right sampler circuit to receive at least one of the N−1 reference voltage levels and a $j^{th}$ shifted sample control signal, the $j^{th}$ right sampler circuit including level activated switching elements responsive to the $j^{th}$ shifted sample control signal and the at least one of the N−1 reference voltage levels to couple a sample of the differential data input signal to the $j^{th}$ right output, the $j^{th}$ shifted sample control signal having a $j^{th}$ level shift from the sample control signal; and wherein the samples of the differential data input signal to be generated in response to a single transition of the sample control signal.

50. The serial multiple sampler circuit of claim 49 wherein,

N equals four, i equals two, j equals two, the $i^{th}$ left sampler circuit is the second left sampler circuit, and the $j^{th}$ right sampler circuit is the second right sampler circuit.

51. The serial multiple sampler circuit of claim 49 wherein,

N is an even number, i is equal to j, and i and j take on all consecutive integer values from two through N/2.

52. The serial multiple sampler circuit of claim 51 wherein, the $i^{th}$ left sampler circuit is one or more left sampler circuits, and the $j^{th}$ right sampler circuit is one or more right sampler circuits.

53. The serial multiple sampler circuit of claim 49 wherein,

N is an odd number, i takes on all consecutive integer values from two through (N+1)/2, and j takes on all consecutive integer values from two through N/2.

54. The serial multiple sampler circuit of claim 53 wherein, the $i^{th}$ left sampler circuit is one or more left sampler circuits, and the $j^{th}$ right sampler circuit is one or more right sampler circuits.

55. The serial multiple sampler circuit of claim 49 wherein,

N is an odd number, i takes on all consecutive integer values from two through N/2, and j takes on all consecutive integer values from two through (N+1)/2.

56. The serial multiple sampler circuit of claim 55 wherein, the $i^{th}$ left sampler circuit is one or more left sampler circuits, and the $j^{th}$ right sampler circuit is one or more right sampler circuits.

* * * * *